United States Patent
Uehara et al.

(10) Patent No.: US 8,189,424 B2
(45) Date of Patent: May 29, 2012

(54) SEMICONDUCTOR MEMORY DEVICE HAVING PLURALITY OF TYPES OF MEMORIES INTEGRATED ON ONE CHIP

(75) Inventors: Kazuto Uehara, Sagamihara (JP); Toshifumi Watanabe, Yokohama (JP); Shigefumi Ishiguro, Chigasaki (JP); Kazuyoshi Muraoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 601 days.

(21) Appl. No.: 12/397,711

(22) Filed: Mar. 4, 2009

(65) Prior Publication Data

US 2009/0316494 A1   Dec. 24, 2009

(30) Foreign Application Priority Data

Jun. 24, 2008   (JP) ................................. 2008-165012

(51) Int. Cl.
  *G11C 8/00*   (2006.01)
(52) U.S. Cl. ..................... 365/233.1; 365/194; 365/236
(58) Field of Classification Search ............. 365/230.01, 365/230.06, 194, 203, 236, 233.11, 233.12, 365/189.05, 189.06
See application file for complete search history.

(56) References Cited

U.S. PATENT DOCUMENTS

| | | | | |
|---|---|---|---|---|
| 6,385,709 B2 * | 5/2002 | Merritt | ........................ | 711/167 |
| 6,438,063 B1 * | 8/2002 | Lee | ........................ | 365/230.03 |
| 2006/0224789 A1 | 10/2006 | Cho et al. | | |

FOREIGN PATENT DOCUMENTS

| | | |
|---|---|---|
| JP | 2008-65863 | 3/2008 |
| JP | 2008-84499 | 4/2008 |

OTHER PUBLICATIONS

U.S. Appl. No. 12/836,944, filed Jul. 15, 2010, Watanabe et al.
U.S. Appl. No. 12/836,851, filed Jul. 15, 2010, Hamano et al.

* cited by examiner

*Primary Examiner* — Richard Elms
*Assistant Examiner* — Hien Nguyen
(74) *Attorney, Agent, or Firm* — Oblon, Spivak, McClelland, Maier & Neustadt, L.L.P.

(57) ABSTRACT

A semiconductor memory device configured to perform a clock synchronous burst read operation includes a plurality of buffer memories having different bank structures, and first and second data latch circuits storing read data read from the plurality of buffer memories. The semiconductor memory device further includes a control circuit that controls a timing of starting counting up addresses and a timing of storing read data in the first data latch circuit at the time of the clock synchronous burst read operation in accordance with the bank structure of the buffer memory as a read operation target.

19 Claims, 19 Drawing Sheets

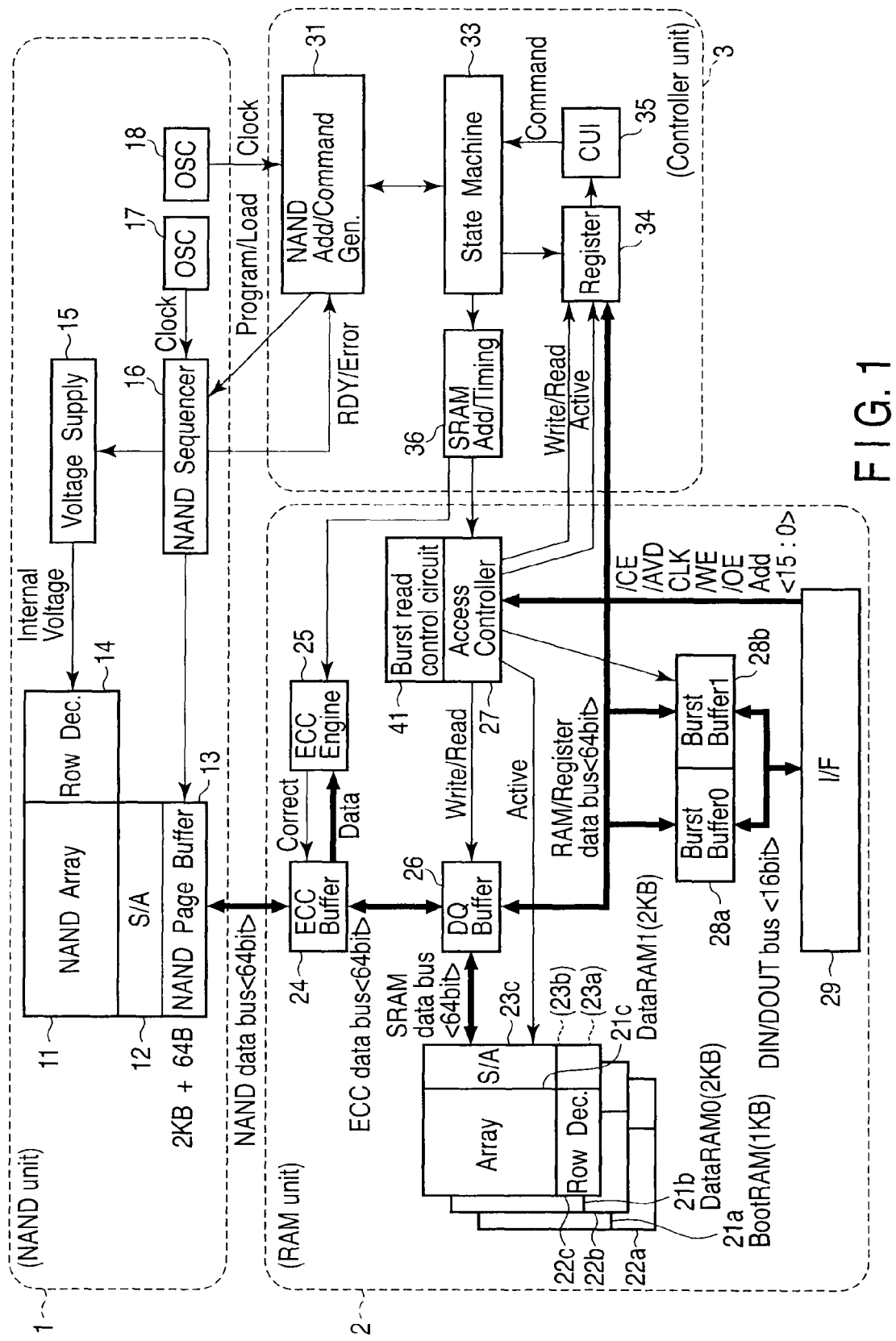
F I G. 1

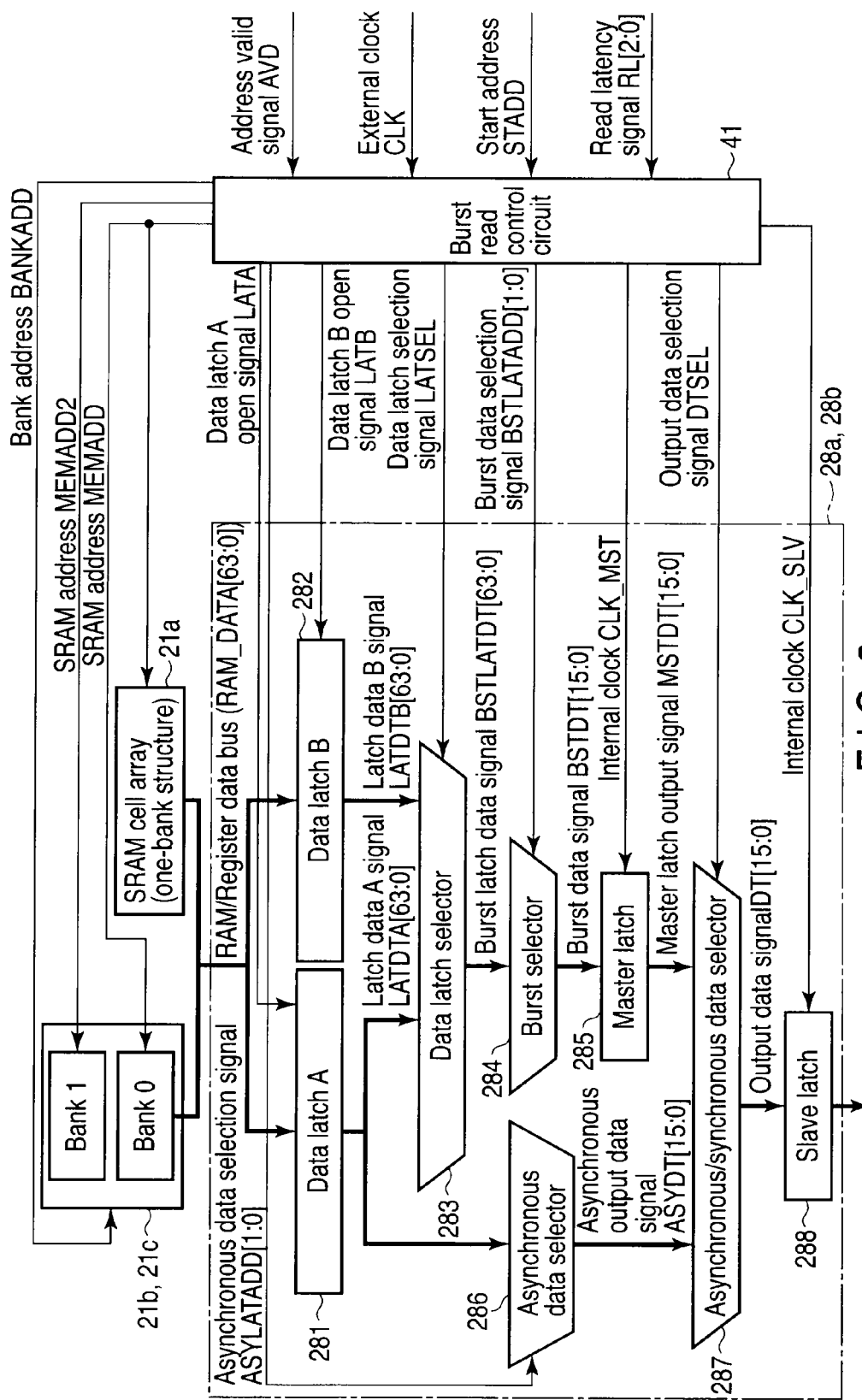
F I G. 2

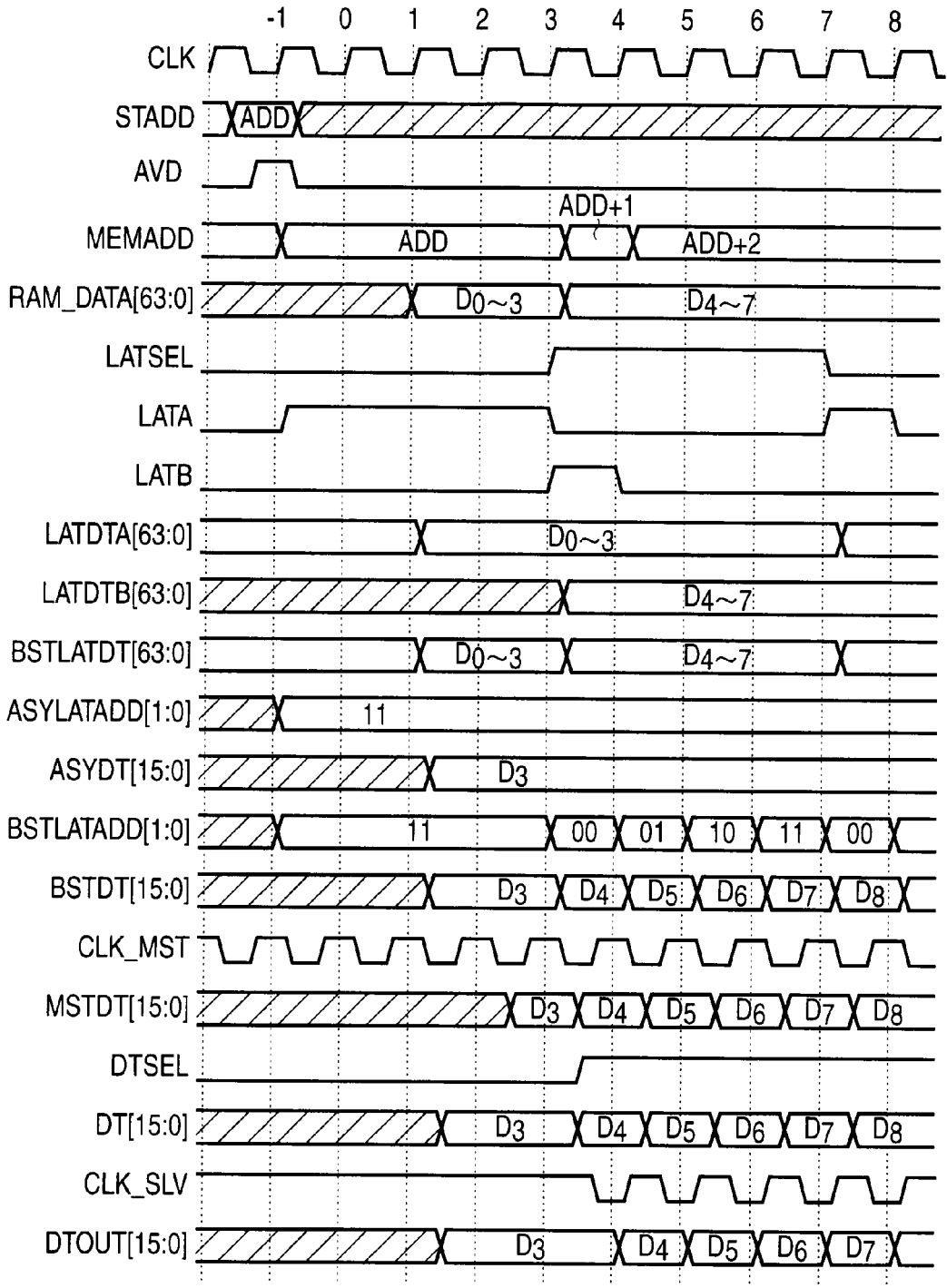
F I G. 3

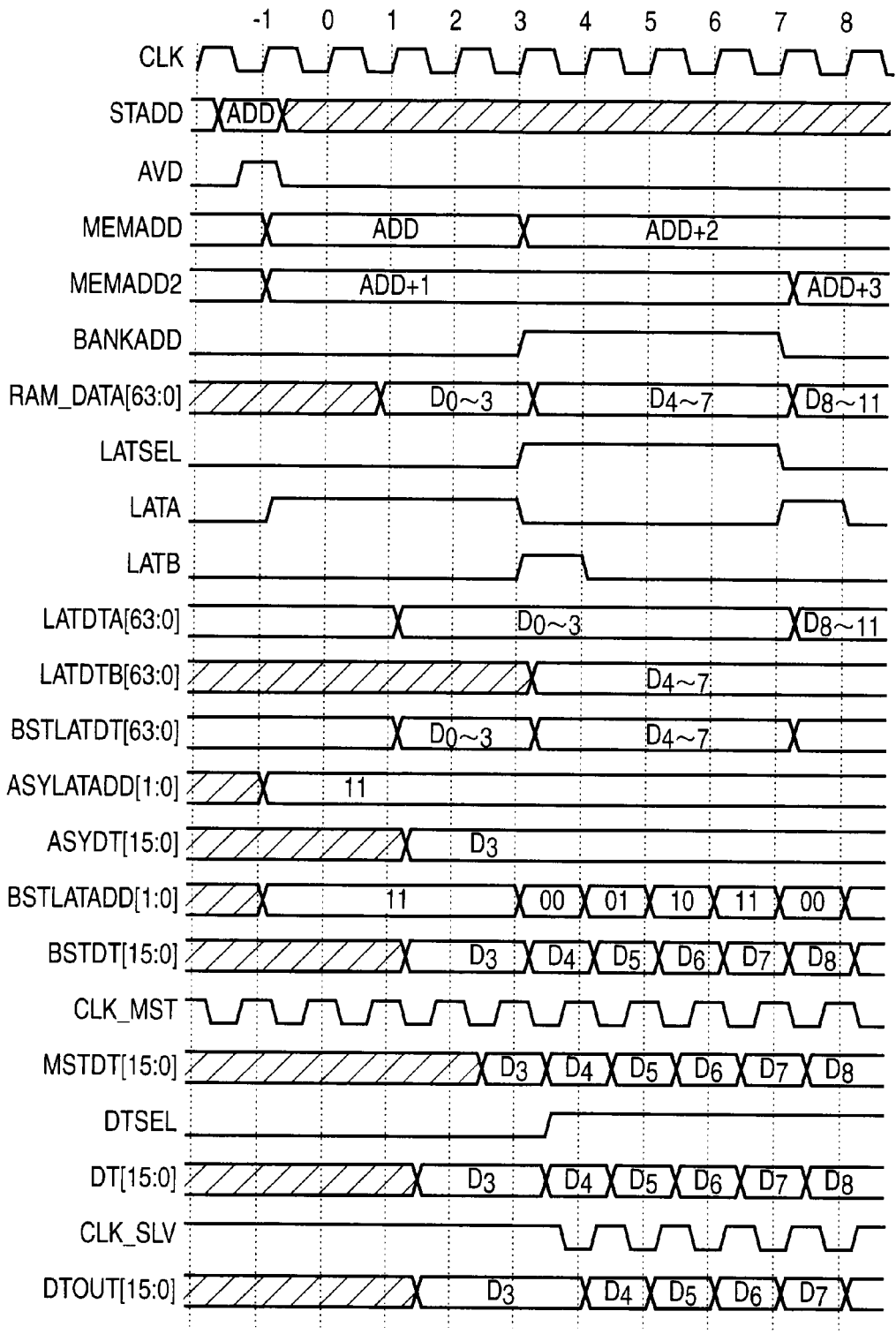
F I G. 4

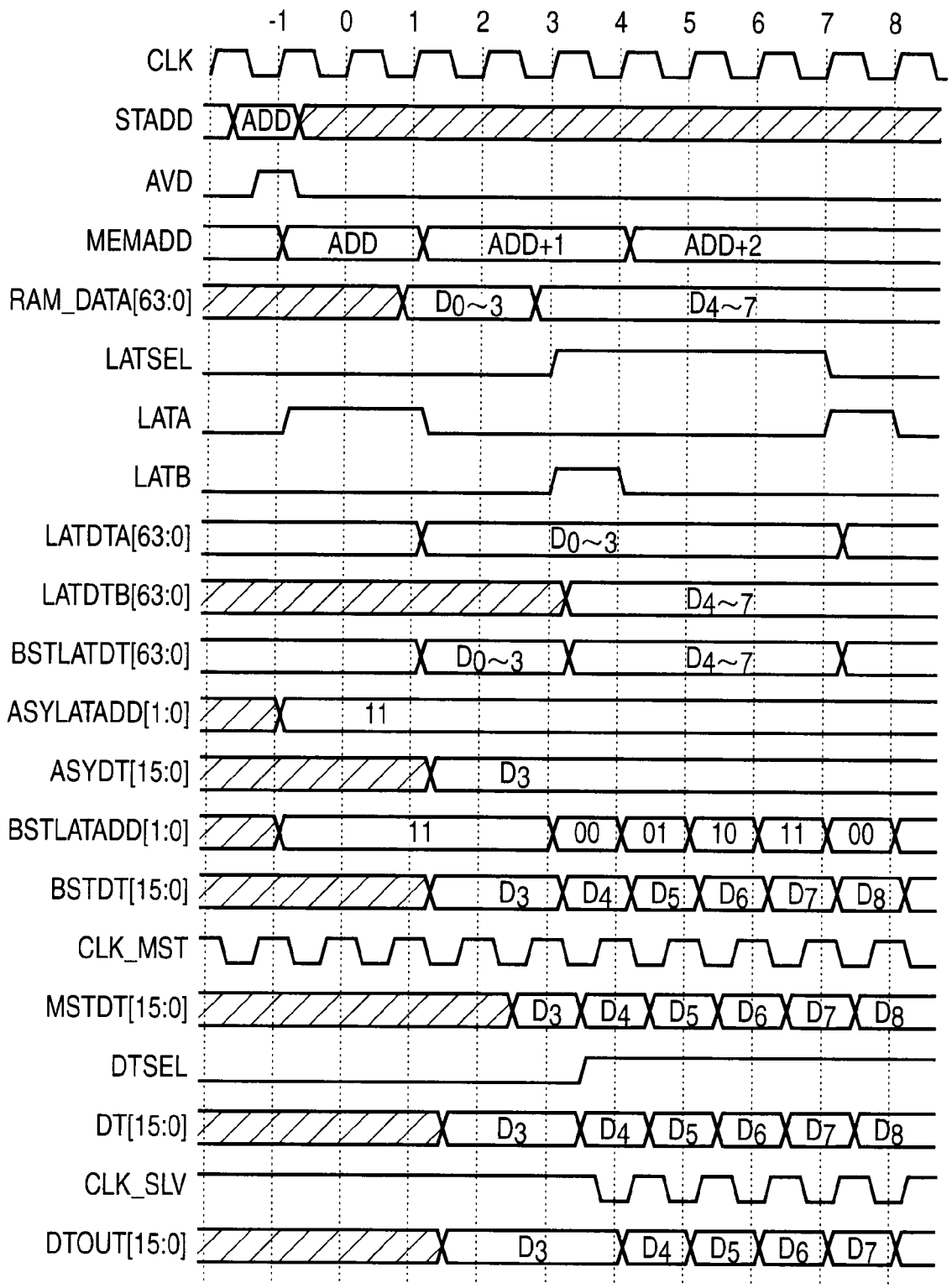
F I G. 5

*Fig. 7A(1)*

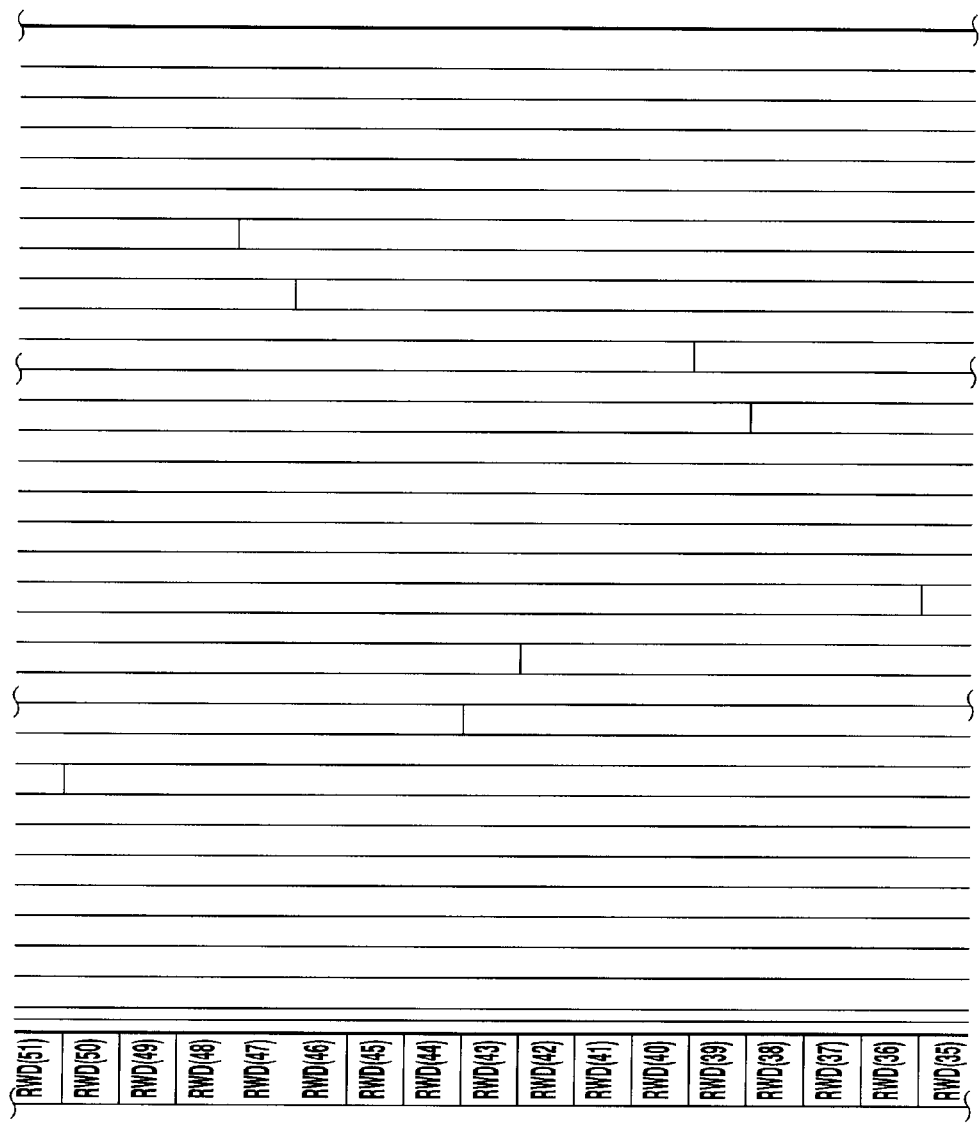
Fig. 7A(2)

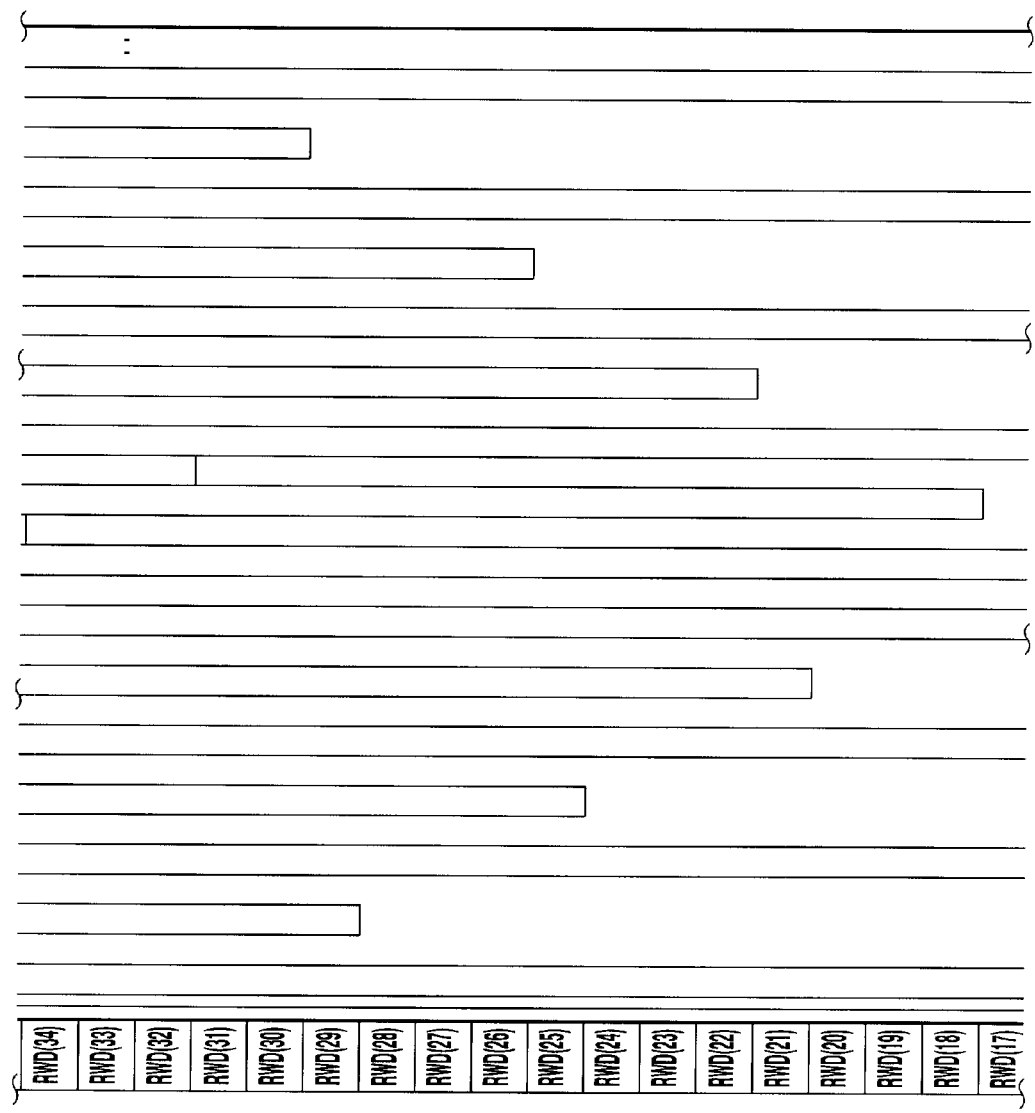
Fig. 7A(3)
Bank 0

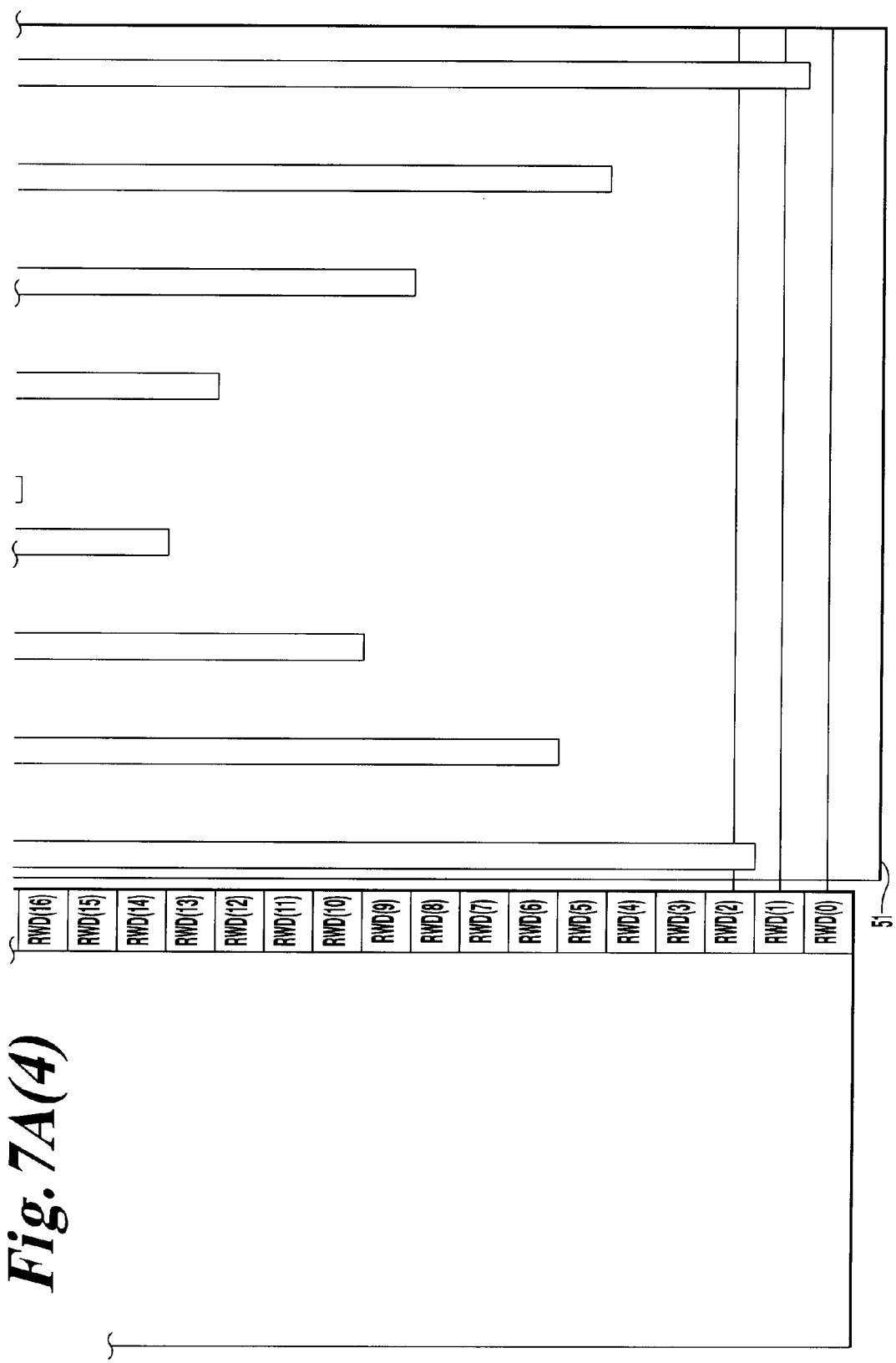
Fig. 7A(4)

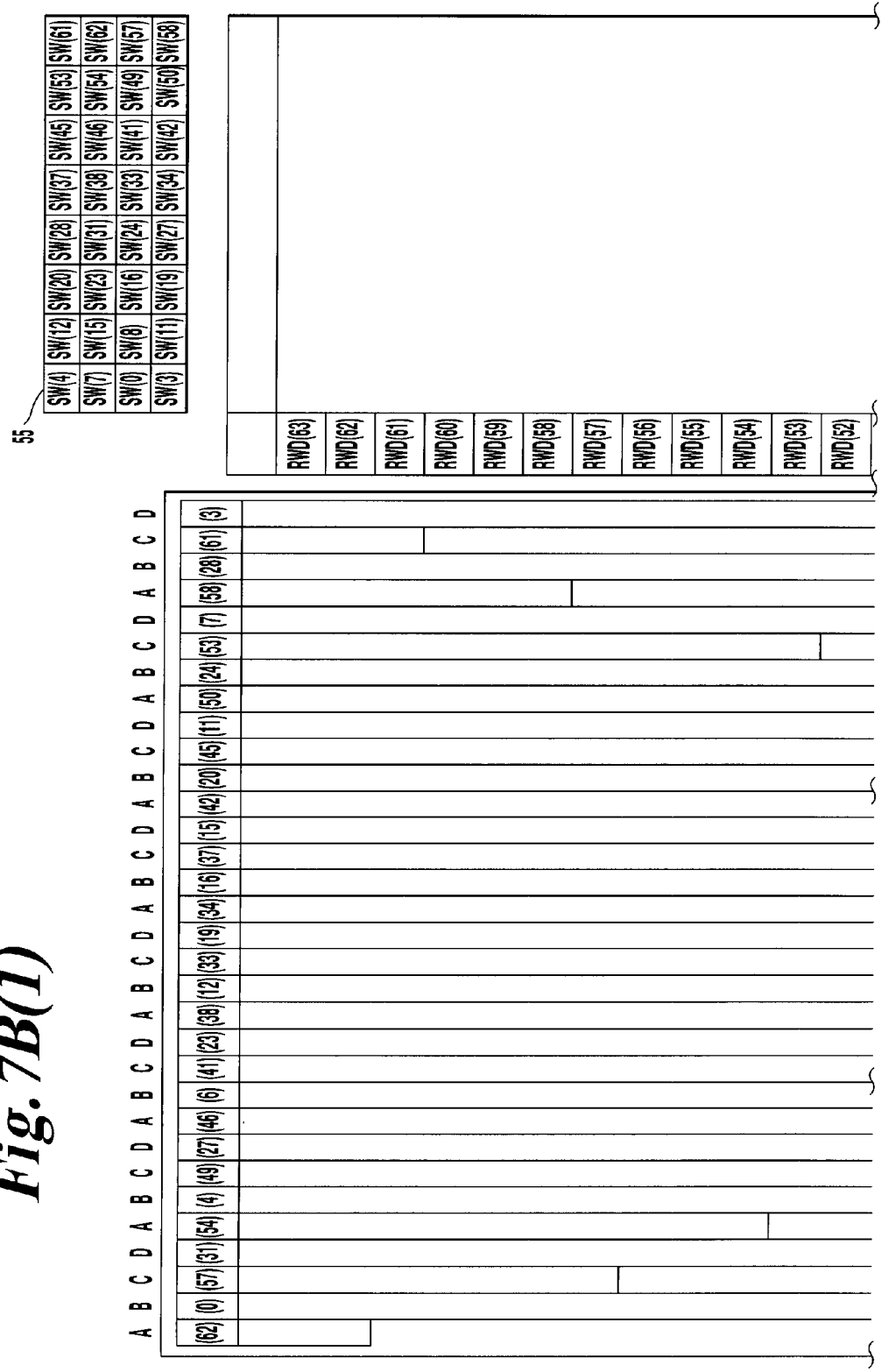
Fig. 7B(1)

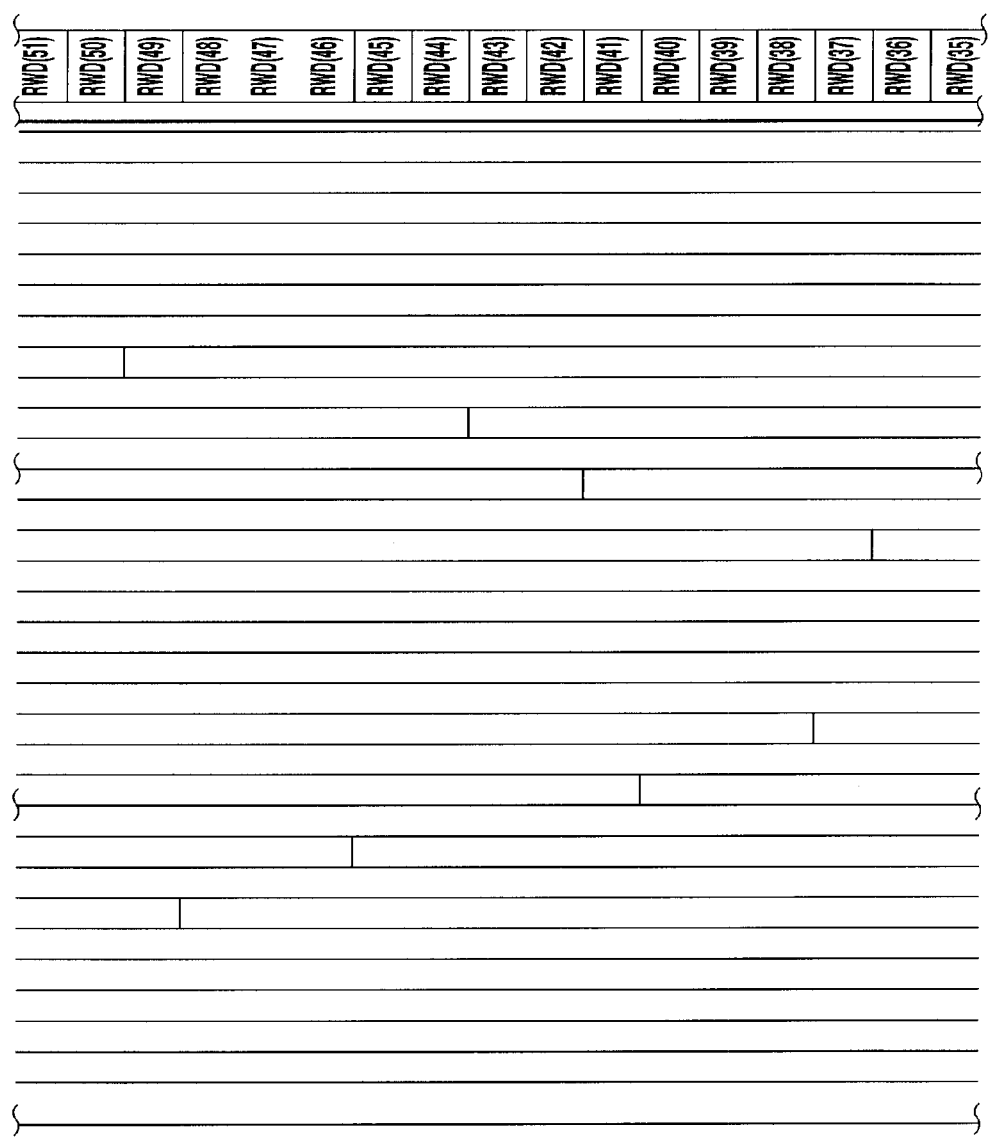
Fig. 7B(2)

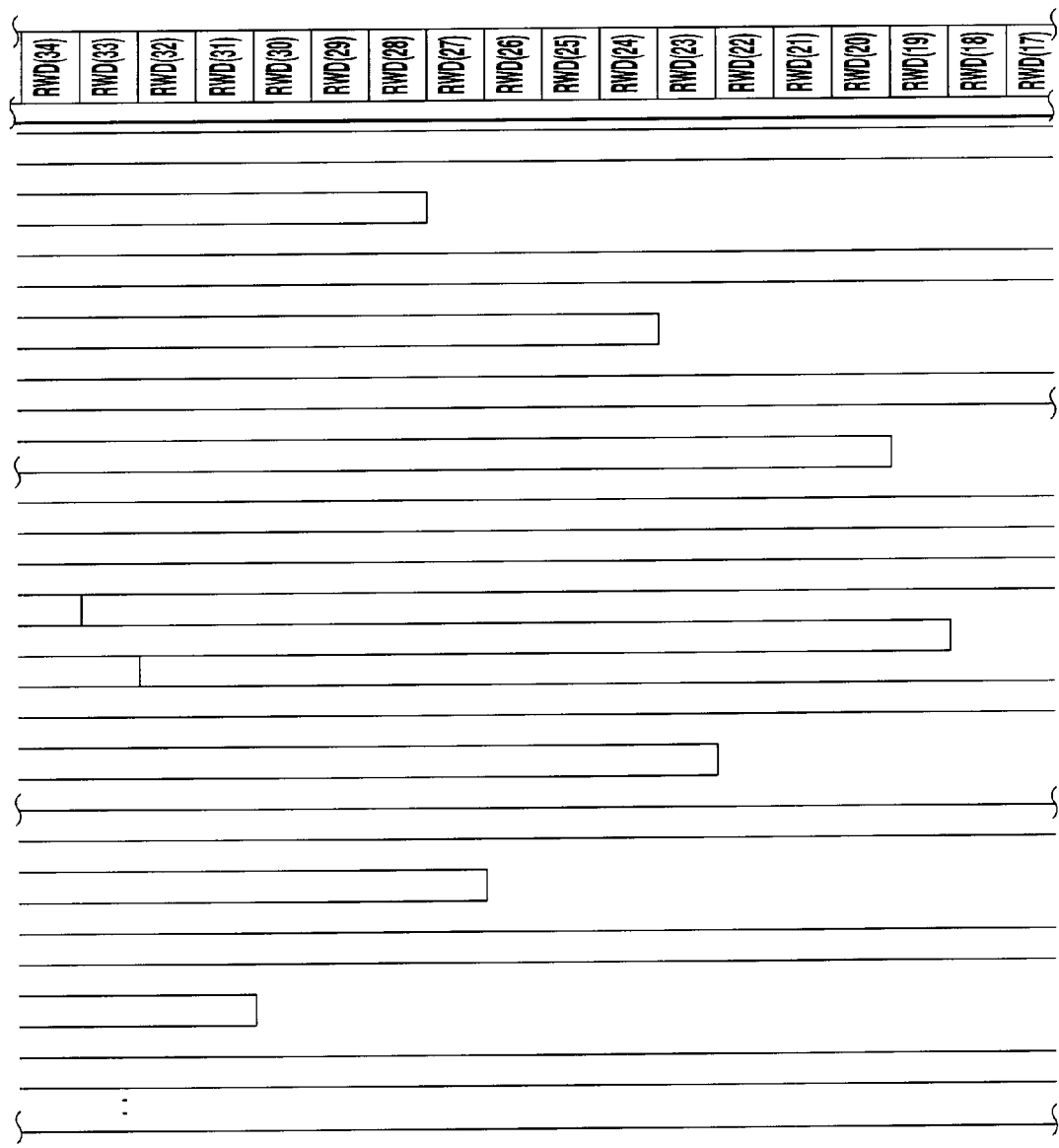
Fig. 7B(3)

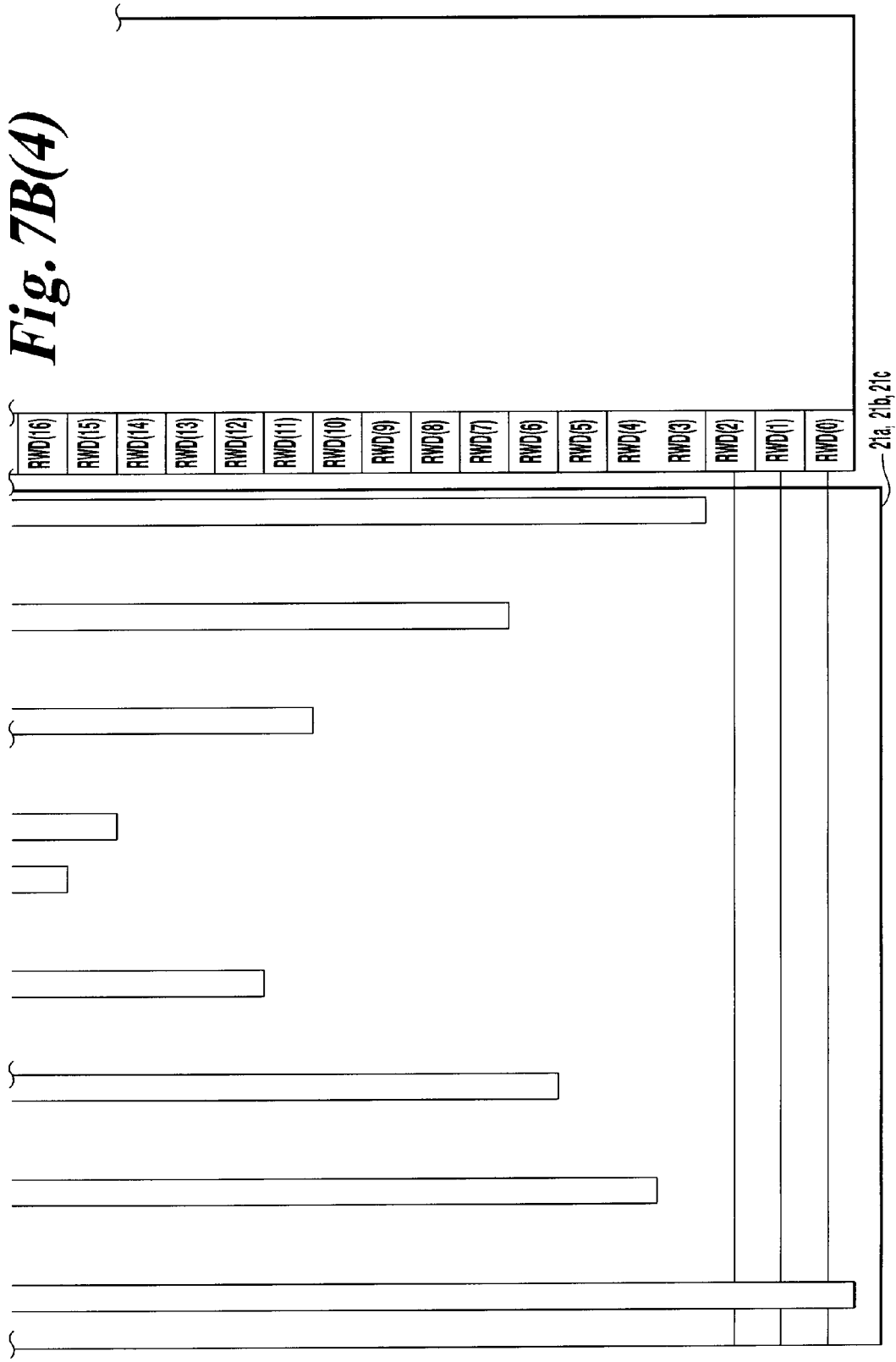

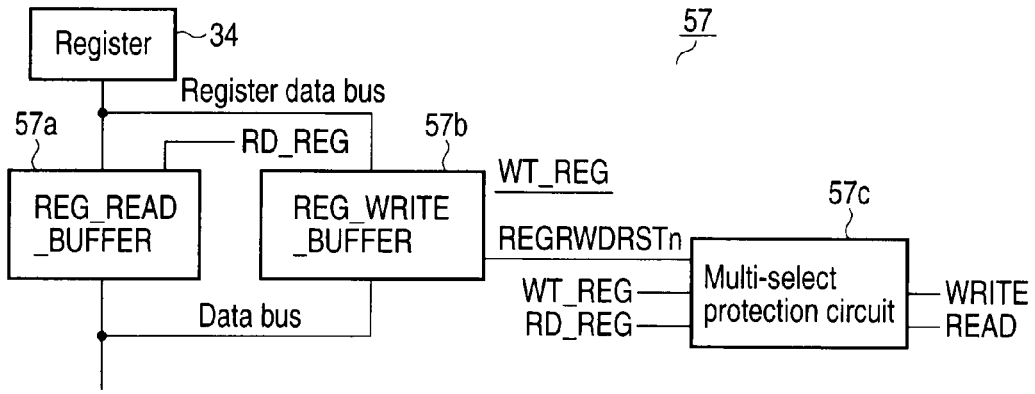
F I G. 1 3
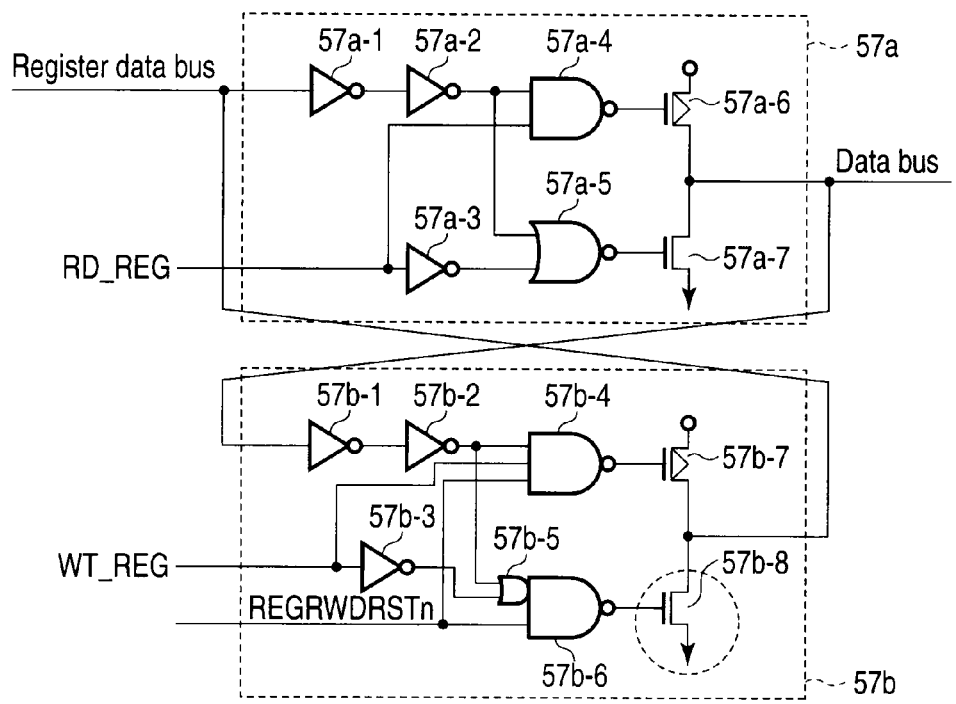
F I G. 1 4

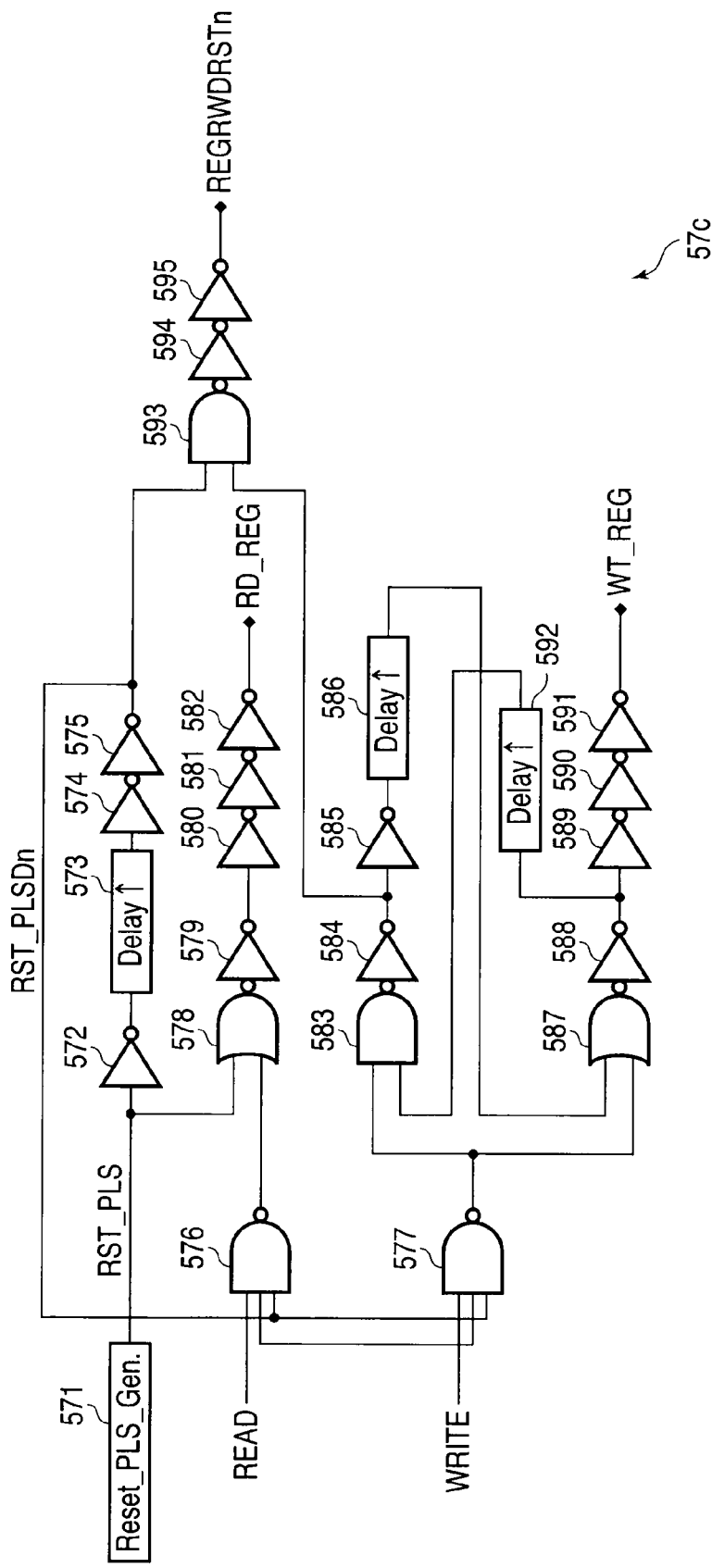
F I G. 15

SEMICONDUCTOR MEMORY DEVICE HAVING PLURALITY OF TYPES OF MEMORIES INTEGRATED ON ONE CHIP

CROSS-REFERENCE TO RELATED APPLICATIONS

This application is based upon and claims the benefit of priority from prior Japanese Patent Application No. 2008-165012, filed Jun. 24, 2008, the entire contents of which are incorporated herein by reference.

BACKGROUND OF THE INVENTION

1. Field of the Invention

The present invention relates to a semiconductor memory device. More particularly, the present invention relates to a semiconductor memory device having a plurality of types of memories integrated on one chip.

2. Description of the Related Art

As an example of a semiconductor memory device having a plurality of types of memories integrated on one chip, there is a OneNAND (a registered trademark) (see, for example, Jpn. Pat. Appln. KOKAI Publication No. 2006-286179).

BRIEF SUMMARY OF THE INVENTION

According to a first aspect of the present invention, there is provided a semiconductor memory device configured to perform a clock synchronous burst read operation, comprising: a plurality of buffer memories having different bank structures; first and second data latch circuits storing read data read from the plurality of buffer memories; and a control circuit that controls a timing of starting counting up addresses and a timing of storing read data in the first data latch circuit at the time of the clock synchronous burst read operation in accordance with the bank structure of the buffer memory as a read operation target.

According to a second aspect of the present invention, there is provided a semiconductor memory device configured to perform a clock synchronous burst read operation, comprising: a plurality of buffer memories having different bank structures; first and second data latch circuits storing read data read from the plurality of buffer memories; and a control circuit that controls a timing of starting counting up addresses and a timing of storing read data in the first data latch circuit at the time of the clock synchronous burst read operation in accordance with a read latency signal.

BRIEF DESCRIPTION OF THE SEVERAL VIEWS OF THE DRAWING

FIG. 1 is a block diagram showing a structural example of a semiconductor memory device according to a first embodiment of the present invention;

FIG. 2 is a block diagram showing a structural example of a burst buffer that realizes a clock synchronous burst read function included in the semiconductor memory device according to the embodiment;

FIG. 3 is a timing chart for explaining an operation when executing a general clock synchronous burst read function with respect to a buffer memory having a one-bank structure;

FIG. 4 is a timing chart for explaining an operation when executing the general clock synchronous burst read function with respect to a buffer memory having a two-bank structure;

FIG. 5 is a timing chart for explaining an operation when executing a clock synchronous burst read function according to the embodiment with respect to the buffer memory having the one-bank structure;

FIGS. 7A(1), 7A(2), 7A(3), 7A(4), 7B(1), 7B(2), 7B(3), and 7B(4) are views showing a layout example of data lines in the semiconductor memory device according to the embodiment;

FIG. 13 is a block diagram showing a primary part of a structure of a semiconductor memory device according to a fourth embodiment of the present invention;

FIG. 14 is a circuit diagram showing a structural example of a read buffer and a write buffer constituting a switch circuit in the semiconductor memory device according to the embodiment;

FIG. 15 is a circuit diagram showing a structural example of a multi-select protection circuit constituting the switch circuit in the semiconductor memory device according to the embodiment;

DETAILED DESCRIPTION OF THE INVENTION

Figure 6:
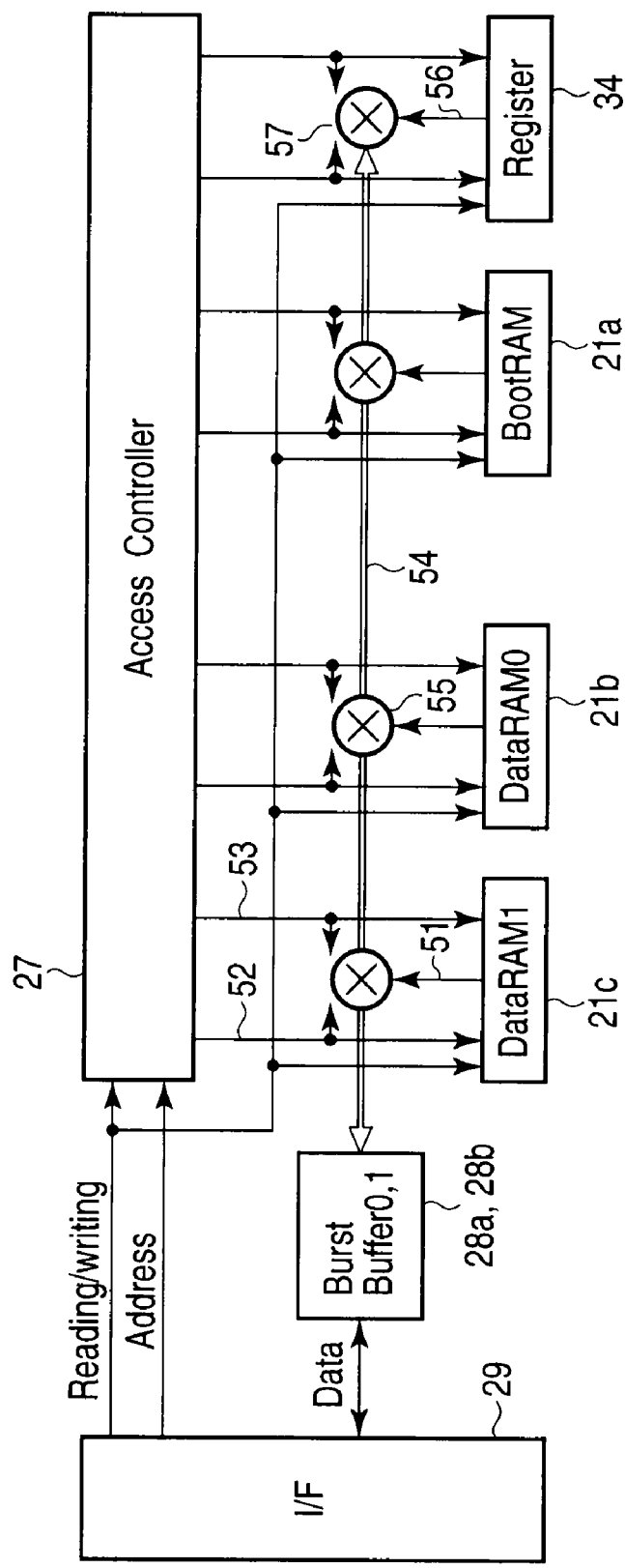
FIG. 6 is a block diagram showing a primary part of a structure of a semiconductor memory device according to a second embodiment of the present invention.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

A OneNAND has a structure in which a NAND type flash memory as a main storage unit, a static random access memory (SRAM) as a buffer unit, etc. are integrated on one chip. Further, for the OneNAND, a controller having a state machine mounted thereon is prepared to control data transfer between, e.g., the NAND type flash memory and the SRAM.

In the OneNAND, the SRAM can be constituted of a plurality of buffer memories having different bank structures. Furthermore, the OneNAND can perform a read operation called a clock synchronous burst read function when it includes at least first and second data latches. A clock synchronous burst read function is a function of alternately storing several pieces of data read from a given buffer memory into a plurality of data latches.

However, in a conventional OneNAND including, e.g., a buffer memory constituted of one bank (a BootRAM) and a buffer memory constituted of two banks (a DataRAM), a timing at which read data is stored in the first or second data latch and a timing at which counting up addresses is started at the time of executing the clock synchronous burst read function have the same setting irrespective of the bank structure of the buffer memory that is a read target. That is, settings of the timing at which read data is stored in the first or second data latch and the timing at which counting up addresses is started at the time of execution of the clock synchronous burst read function with respect to the buffer memory constituted of one bank are equal to those at the time of execution of the clock synchronous burst read function with respect to the buffer memory constituted of two banks. Therefore, in a case where the buffer memory constituted of one bank is determined as a read target to execute the clock synchronous burst read function, there is a problem that a speed of a clock frequency cannot be increased when a start address is a last column address.

[First Embodiment]

FIG. 1 shows a structural example of a semiconductor memory device according to a first embodiment of the present invention. A semiconductor memory device as typified by a OneNAND will be taken as an example, and an explanation will be given as to a case where a clock synchronous burst read function is executed with respect to an SRAM cell array constituted of a plurality of buffer memories having different bank structures.

As shown in FIG. 1, in this semiconductor memory device, a NAND type flash memory 1 as a main storage unit (a NAND unit), an SRAM 2 as a buffer unit (an RAM unit), and a controller 3 as a controller unit that controls the NAND type flash memory 1 and the SRAM 2 are integrated on one chip.

The NAND type flash memory 1 includes a memory cell array (NAND Array) 11, a sense amplifier (S/A) 12, a page buffer (NAND Page Buffer) 13, a row decoder (Row Dec.) 14, a voltage supply circuit (Voltage Supply) 15, a sequencer (NAND Sequencer) 16, and oscillators (OSCs) 17 and 18.

The memory cell array 11 is a cell array of the NAND type flash memory 1, and includes a plurality of matrix-like memory cells (not shown) respectively arranged at intersections of bit lines and word lines. Each of the plurality of memory cells is constituted of, e.g., a metal oxide semiconductor (MOS) type transistor having a laminated gate structure including a floating gate electrode, an inter-gate insulating film, and a control gate electrode sequentially laminated on a semiconductor substrate through a tunnel insulating film.

Moreover, each of the plurality of memory cells can hold one-bit data in accordance with a change in threshold voltage due to the amount of electrons injected into the floating gate electrode, for example. It is to be noted that control over the threshold voltage may be segmented to enable holding data of two or more bits in each memory cell. Additionally, the memory cell may have a metal oxide nitride oxide silicon (MONOS) structure using a scheme of trapping electrons in a nitride film.

The sense amplifier 12 reads data in cells corresponding to one page in the memory cell array 11. Here, "page" means a unit of data collectively programmed with respect to the NAND type flash memory 1 or a unit of data collectively loaded with respect to the same. For example, "one page" is constituted of a plurality of memory cells connected with the same word line.

The page buffer 13 temporarily stores read data (load data) or write data (program data) corresponding to one page under control of the sequencer 16, and has a storage capacity of, e.g., 2 KB (kilobytes)+64 B (bytes).

The row decoder 14 is a decoder that is used to select a word line in the memory cell array 11.

The voltage supply circuit 15 generates a voltage (Internal Voltage) required for a read (load) operation, a write (program) operation, or an erase operation with respect to the memory cell array 11 under control of the sequencer 16, and supplies this voltage to the row decoder 14.

The sequencer 16 performs control over the program operation, the load operation, or the erase operation with respect to the NAND type flash memory 1 upon receiving a command (program/load) for the NAND type flash memory 1 issued in an address/command generation circuit (NAND Add/Command Gen.) 31.

The oscillator 17 generates an internal clock Clock for an internal control circuit of the sequencer 16, and the oscillator 18 generates an internal clock Clock for an internal control circuit of a state machine 33.

The SRAM 2 includes a plurality of (three in this example) SRAM cell arrays (Array) $21a$ to $21c$, a plurality of row decoders (Row Dec.) $22a$ to $22c$, a plurality of sense amplifiers (S/A) $23a$ to $23c$, an error correction circuit (ECC) buffer 24, an ECC engine 25, a DQ (SRAM) buffer 26, an access controller 27, burst buffers (Burst Read/Write buffer) $28a$ and $28b$, and a user interface (I/F) 29.

Each of the SRAM cell arrays $21a$ to $21c$ is used as a buffer memory that stores write data that is programmed to the NAND type flash memory 1 or read data loaded from the NAND type flash memory 1 and transmits/receives such data to/from a non-illustrated external host device. Each of the SRAM cell arrays $21a$ to $21c$ includes a plurality of matrix-like memory cells (SRAM cells) respectively arranged at intersections of word lines and bit lines.

Each of the row decoders $22a$ to $22c$ is a decoder that is used to select a word line for each of the SRAM cell arrays $21a$ to $21c$.

Each of the sense amplifiers $23a$ to $23c$ reads data in each SRAM cell. Further, each of the sense amplifiers $23a$ to $23c$ also functions as a load for writing.

In this embodiment, for example, the SRAM cell array $21a$ is a buffer memory that functions as a BootRAM constituted of one bank, i.e., a bank 0 (1 KB). The SRAM cell array $21b$ is a buffer memory that functions as a DataRAM 0 constituted of two banks, i.e., banks 0 and 1 (2 KB). The SRAM cell array $21c$ is a buffer memory that functions as a DataRAM 1 constituted of two banks, i.e., banks 0 and 1 (2 KB). It is to be noted that the number of the DataRAMs is not restricted to two (DataRAMs 0 and 1), and more DataRAMs may be provided.

The ECC buffer 24 is provided between the SRAM 2 and the page buffer 13, and temporarily stores data for ECC processing (error correction at the time of loading data/parity generation at the time of programming data).

The ECC engine 25 corrects an error in data (Data) input to the ECC buffer 24 and outputs corrected data (Correct) to the ECC buffer 24.

The DQ buffer 26 temporarily stores data to read data (Read) from the SRAM cell arrays $21a$ to $21c$ and to write data (Write) into the SRAM cell arrays $21a$ to $21c$.

The access controller 27 receives an address signal (Add <15:0>) and a control signal (/CE, /AVD, CLK, /WE, /OE)

input from the user interface 29 to execute necessary control over respective internal circuits.

For example, a burst read control circuit 41 that executes a clock synchronous burst read function is additionally provided to this access controller 27. The burst read control circuit 41 controls the burst buffers (Burst buffer 0) 28a and (Burst Buffer 1) 28b when executing the clock synchronous burst read function.

Each of the burst buffers 28a and 28b is a buffer that temporarily stores data for data reading and data writing.

The user interface 29 supports the same interface standard as that of a NOR type flash memory, and performs input of an address signal and a control signal from the external host device, input/output of data from/to the external host device, etc.

The controller 3 includes an address/command generation circuit 31, a state machine 33, a register 34, a CUI (Command User Interface) 35, and an address/timing generation circuit (SRAM Add/Timing) 36.

The address/command generation circuit 31 generates an address signal or a control signal such as a command with respect to a NAND core (a NAND unit) at the time of an internal sequence operation as required.

The state machine 33 controls the internal sequence operation according to the type of command in response to issuance of the command by the address/command generation circuit 31 or an internal command signal (Command) from the CUI 35.

The register 34 sets a function operating state, and an address signal or a control signal such as a command is read or written by the external host device via the user interface 29 when a part of an external address space is assigned.

When an address signal or a control signal such as a command is written in a predetermined external address space of the register 34, the CUI 35 recognizes that a function execution command is supplied and issues an internal command signal.

The address/timing generation circuit 36 generates an address signal or a control signal such as a timing required to control the SRAM 2 at the time of an internal sequence operation as required.

In this embodiment, the page buffer 13 is connected with the ECC buffer 24 via a 64-bit NAND data bus. Moreover, the ECC buffer 24 is connected with the DQ buffer 26 via a 64-bit ECC data bus. Additionally, the DQ buffer 26 is connected with the sense amplifiers 23a to 23c via a 64-bit SRAM data bus. Further, the DQ buffer 26, the burst buffers 28a and 28b, and the register 34 are connected with each other through a 64-bit (4×16·I/O) RAM/Register data bus. Furthermore, each of the burst buffers 28a and 28b is connected with the user interface 29 through a 16-bit Data Input/Output (DIN/DOUT) bus.

A basic operation of the thus configured semiconductor memory device will now be briefly explained. A regular read operation of reading data written in the memory cell array 11 will be described.

In a regular read operation, a user first sets a NAND address and an SRAM address of data to be loaded with respect to the register 34 from the external host device through the user interface 29. Moreover, the user sets a load command with respect to the register 34 from the external host device via the user interface 29. When the command is written in the register 34, the CUI 35 recognizes that the written command is a function execution command, thereby generating an internal command signal. In this case, a load command is achieved.

Upon accepting achievement of this load command, the state machine 33 is activated. The state machine 33 initializes necessary circuits, and then outputs a request to the address/command generation circuit 31 to issue a sense command for the NAND unit.

Then, the address/command generation circuit 31 issues a sense command with respect to the sequencer 16 in order to sense data having the NAND address set in the register 34.

Upon receiving this sense command, the sequencer 16 is activated. The sequencer 16 initializes necessary circuits, and then controls the voltage supply circuit 15, the row decoder 14, the sense amplifier 12, and the page buffer 13 to perform a sensing operation for the specified NAND address. Additionally, sense data (cell data) loaded from the memory cell array 1 is stored in the page buffer 13. Further, sequencer 16 informs the state machine 33 that the sensing operation with respect to the memory cell array 11 is finished when the sense data is stored in the page buffer 13.

Upon receiving this information, the state machine 33 requests the address/command generation circuit 31 to issue a read command (Clock).

The read command from the address/command generation circuit 31 is supplied to the sequencer 16, and the sequencer 16 that has received this read command sets the page buffer 13 to enable a read operation.

When the read command from the address/command generation circuit 1 is supplied to the sequencer 16 in response to the request from the state machine 33 in this manner, data in the page buffer 13 is read to the NAND data bus, and this data is transferred to the ECC buffer 24.

Thereafter, an ECC correction start control signal is issued from the state machine 33 via the address/timing generation circuit 36. As a result, the ECC engine 25 corrects an error in the data from the ECC buffer 24, and outputs the data subjected to error correction to the ECC buffer 24. Furthermore, the error-corrected data in the ECC buffer 24 is read to the ECC data bus and transferred to the DQ buffer 26.

The DQ buffer 26 supplies stored data to the corresponding SRAM cell array 21 from the SRAM data bus via the sense amplifier 23b, for example. The SRAM cell array 21b writes the data in accordance with an SRAM address.

On the other hand, with input of a control signal required to read data from the external host device by the user via the user interface 29, the access controller 27 reads the data to the DQ buffer 26 from the SRAM cell array 21b through the SRAM data bus. Moreover, for example, the data is output to the external host device through the RAM/Register data bus, the burst buffer 28a, and the user interface 29.

Then, the regular read operation is terminated.

A clock synchronous burst read function included in the semiconductor memory device having the above-described structure will now be explained with reference to FIGS. 2 to 5. It is to be noted that FIG. 2 shows a structural example of the burst buffer 28a or 28b that realizes the clock synchronous burst read function. FIG. 3 shows operation waveforms at the time of executing a general clock synchronous burst read function with the SRAM cell array 21a being determined as a read target when a read latency is set to "4" and a start address is set to a last column address in the SRAM cell array 21a. FIG. 4 shows operation waveforms at the time of executing the general clock synchronous burst read function with each of the SRAM cell arrays 21b and 21c being determined as a read target when a read latency is set to "4" and a start address is set to a last column address in the SRAM cell array 21b or 21c. FIG. 5 shows operation waveforms at the time of executing a clock synchronous burst read function according to this embodiment with the SRAM cell array 21a being determined as a read target when a read latency is set to "4" and a start address is set to a last column address in the SRAM cell array 21*a*.

As shown in FIG. 2, each of the burst buffers 28*a* and 28*b* has first and second data latches (A) 281 and (B) 282, a data latch selector 283, a burst data selector 284, a master latch 285, an asynchronous data selector 286, an asynchronous/synchronous data selector 287, and a slave latch 288. The burst buffers 28*a* and 28*b* are controlled by the burst read control circuit 41. It is to be noted that the DQ buffer 26 depicted in FIG. 1 is omitted.

Here, the burst read control circuit 41 is a circuit that generates a control signal with respect to each data bus circuit from a RAM/Register data bus (RAM_DATA [63:0]) to a DIN/DOUT bus (an output data signal DTOUT [15:0]). For example, the burst read control circuit 41 stores a start address STADD from the access controller 27 in a high-level (High) period of an address valid signal AVD and generates SRAM addresses MEMADD and MEMADD2. Additionally, the burst read control circuit 41 generates a bank address BANKADD, a data latch A open signal LATA, an asynchronous data selection signal ASYLATADD [1:0], a data latch B open signal LATB, a latch data selection signal LATSEL, a burst data selection signal BSTLATADD [1:0], internal clocks CLK_MST and CLK_SLV, and an output data selection signal DTSEL.

The SRAM cell array 21*a* is a buffer memory constituted of one bank. This SRAM cell array 21*a* outputs data having row and column addresses (RAM_DATA [63:0]) decoded from the SRAM address MEMADD by the row decoder 22*a* to the RAM/Register data bus.

Each of the SRAM cell arrays 21*b* and 21*c* is constituted of two banks, i.e., a bank 0 and a bank 1. Each of the SRAM cell arrays 21*b* and 21*c* reads data having row and column addresses (RAM_DATA [63:0]) decoded from the SRAM address MEMADD by the row decoder 22*b* or 22*c* from the bank 0. Further, it reads data having row and column addresses (RAM_DATA [63:0]) decoded from the SRAM address MEMADD2 by the row decoder 22*b* or 22*c* from the bank 1. Furthermore, each read data is output to the RAM/Register data bus.

The bank address BANKADD generated by the burst read control circuit 41 is an address required to select one of the banks in the SRAM cell array 21*b* or 21*c* so that data read out from the selected bank is output to the RAM/Register data bus. For example, when the bank address BANKADD is at a low level (Low), data read from the bank 0 of each SRAM cell array 21*b* or 21*c* is output to the RAM/Register data bus. When the bank address BANKADD is High, data read from the bank 1 of each SRAM cell array 21*b* or 21*c* is output to the RAM/Register data bus.

In the burst buffer 28*a* or 28*b*, the data latch (A) 281 and the data latch (B) 282 are circuits storing the data (RAM_DATA [63:0]) output to the RAM/Register data bus. The data latch A open signal LATA is a signal that is used to store in the data latch (A) 281 the data output to the RAM/Register data bus from the SRAM cell array 21*a* or the SRAM cell array 21*b* or 21*c* to update a latch data A signal LATDTA [63:0]. When the data latch A open signal LATA is High, the data latch (A) 281 is opened, and the latch data A signal LATDTA [63:0] is updated by using the data (RAM_DATA [63:0]). When the data latch A open signal is Low, the data latch (A) 281 is closed, and the latch data A signal LATDTA [63:0] is maintained as it is. The data latch B open signal LATB is a signal that is used to store in the data latch (B) 282 the data output to the RAM/Register data bus to update a latch data B signal LATDTB [63:0]. When the data latch B open signal LATB is High, the data latch (B) 282 is opened, and the latch data B signal LATDTB [63:0] is updated by using the data (RAM_DATA [63:0]). When the data latch B open signal LATB is Low, the data latch (B) 282 is closed, and the latch data B signal LATDTB [63:0] is maintained as it is.

The asynchronous data selector 286 is a circuit that makes reference to the asynchronous data selection signal ASYLATADD [1:0] to select 16-bit data from the latch data A signal LATDTA [63:0] and outputs the selected data as an asynchronous output data signal ASYDT [15:0].

The data latch selector 283 is a circuit that makes reference to the data latch selection signal LATSEL to select either the latch data A signal LATDTA [63:0] or the latch data B signal LATDTB [63:0] to be output as a burst latch data signal BSTLATDT [63:0]

The burst data selector 284 is a circuit that makes reference to the burst data selection signal BSTLATADD [1:0] to select 16-bit data from the burst latch data signal BSTLATDT [63:0] and outputs the selected data as a burst data signal BSTDT [15:0].

The master latch 285 is a circuit that outputs the burst data signal BSTDT [15:0] as a master latch output signal MSTDT [15:0] in a Low period of the internal clock CLK_MST, and holds the master latch output signal MSTDT [15:0] in a High period of the internal clock CLK_MST.

The asynchronous/synchronous data selector 287 is a circuit that outputs the master latch output signal MSTDT [15:0] as an output data signal DT [15:0] when the output data selection signal DTSEL is high, and outputs the asynchronous output data signal ASYDT [15:0] as the output data signal DT [15:0] when the output data selection signal DTSEL is Low.

The slave latch 288 is a circuit that outputs the output data signal DT [15:0] as an output data signal DTOUT [15:0] in a High period of the internal clock CLK_SLV, and maintains the output data signal DTOUT [15:0] in a Low period of the internal clock CLK_SLV.

A description will now be given as to a general operation in a period from start of execution of the clock synchronous burst read function to output of data (D3) of a first word when the SRAM cell array 21*a* is a read target with reference to FIG. 3. It is to be noted that FIG. 3 shows an example where a read latency is "4" and a last column address of the SRAM cell array 21*a* is set as the start address STADD. Furthermore, in the case of a general clock synchronous burst read function, a timing at which read data loaded to the RAM/Register data bus is stored in the data latch (A) 281 or the data latch (B) 282 and a timing at which counting up addresses is started have the same setting irrespective of a bank structure of each of the SRAM cell arrays 21*a*, 21*b*, and 21*c* as the read target.

In FIG. 3, for example, after the start address STADD is input from the access controller 27, an address value ADD of the start address STADD is stored in the burst read control circuit 41 in a High period of the address valid signal AVD from the access controller 27. The address value ADD stored in the burst read control circuit 41 is output as the SRAM address MEMADD, and a first read operation for the SRAM cell array 21 determined as a read target is started.

The SRAM cell array 21*a* decodes addresses of a word line and a column line from the SRAM address MEMADD to select data of a corresponding address, and outputs this data to the RAM/Register data bus. Data consisting of 64 bits (four words) is output per read operation with respect to the SRAM cell array 21*a*. Moreover, when the data latch A open signal LATA is changed to High with rising of a −1st clock of an external clock CLK, the data latch (A) 281 is opened so that first read data with respect to the SRAM cell array 21*a* can be stored in the data latch (A) 281.

Output data of a first word (first access data D3 in FIG. 3) at the time of executing the clock synchronous burst read function is output as asynchronous data rather than clock synchronous data. That is, respective pieces of data (RAM_DATA [63:0]) D0 to D3 are output to the RAM/Register data bus near the first external clock CLK in FIG. 3. When the pieces of data D0 to D3 are output, the data latch A open signal LATA is High, and the data latch (A) 281 is opened. As a result, each of the data D0 to D3 is output as the latch data A signal LATDTA [63:0] from the data latch (A) 281. The latch data A signal LATDTA [63:0] is input to the asynchronous data selector 286. At this moment, since the asynchronous data selection signal ASYLATADD [1:0] is "11", the asynchronous data selector 286 outputs the data D3 as an asynchronous output data signal ASYDT [15:0]. This asynchronous output data signal ASYDT [15:0] (=D3) is input to the asynchronous/synchronous data selector 287. Since the read data of the first word is asynchronously output, the output data selection signal DTSEL becomes Low. As a result, the asynchronous output data signal ASYDT [15:0] (=D3) is output as the output data signal DT [15:0] from the asynchronous/synchronous data selector 287.

It is to be noted that, since the output data of the first word (D3) is asynchronously output, the slave latch 288 is opened by fixing the internal clock CLK_SLV to High until falling of a third external clock CLK.

On the other hand, output data of a second word (D4 in FIG. 3) is output in synchronization with a rising edge of a fourth external clock CLK. Therefore, the burst read control circuit 41 counts up the address value of the SRAM address MEMADD from "ADD" to "ADD+1" in synchronization with a rising edge of a third external clock CLK. Additionally, the data latch open signal LATA is changed to Low simultaneously with counting up of the SRAM address MEMADD, and the pieces of data D0 to D3 are held in the data latch (A) 281. Further, the data latch B open signal LATB is changed to High, and the data latch (B) 282 is opened so that data having the address value ADD+1 can be stored.

Each of pieces of data (RAM_DATA [63:0]) D4 to D7 having the address value ADD+1 output to the RAM/Register data bus is stored in the data latch (B) 282, and then output as the latch data B signal LATDTB [63:0]. Furthermore, when the data latch selection signal LATSEL is changed to High, this latch data B signal LATDTB [63:0] is output as the burst latch data signal BSTLATDT [63:0] from the data latch selector 283.

Moreover, the burst data selection signal BSTLATADD [1:0] becomes "00" at the rising edge of the third external clock CLK. As a result, the burst data selector 284 selects the data D4 from the burst latch data signal BSTLATDT [63:0], and the selected data is output as the burst data signal BSTDT [15:0]. This burst data signal BSTDT [15:0] (=D4) is input to the master latch 285. The master latch 285 outputs the data D4 as the master latch output signal MSTDT [15:0] in synchronization with a falling edge of the third external clock CLK. This master latch output signal MSTDT [15:0] (=D4) is input to the asynchronous/synchronous data selector 287. Moreover, the output data selection signal DTSEL is changed to High in synchronization with the falling edge of the third external clock CLK, and the asynchronous/synchronous data selector 287 outputs the data D4 as the output data signal DT [15:0]. Further, the internal clock CLK_SLV is changed to High with the rising edge of the fourth clock, and the slave latch 288 is opened, whereby the data D4 is output as the output data signal DTOUT [15:0]

As shown in FIG. 3, at the time of executing the general clock synchronous burst read function for the SRAM cell array 21*a* as the read target, when the start address STADD is the last column address in the SRAM cell array 21*a*, the SRAM address MEMADD must be counted up at the third external clock CLK and the operation of changing the row address in the SRAM cell array 21*a* must be performed in order to output the data D4 of the second word as the output data signal DTOUT [15:0]. Therefore, the operation from changing the row address in the SRAM cell array 21*a* to outputting the data D4 as the output data signal DTOUT [15:0] must be executed within one external clock CLK.

A description will now be given as to a general operation from start of execution of the clock synchronous burst read function to output of data (D3) of a first word when the SRAM cell array 21*b* or 21*c* is determined as a read target will now be explained. It is to be noted that FIG. 4 shows an example where a read latency is "4" and a last column address in the SRAM cell array 21*b* or 21*c* is set as the start address STADD.

As shown in FIG. 4, when executing the clock synchronous burst read function with the SRAM cell array 21*b* or 21*c* being determined as a read target, the burst read control circuit 41 outputs the start address STADD (an address value ADD) as the SRAM address MEMADD, and an address value ADD+1 is output as the SRAM address MEMADD2. As a result, in the SRAM cell array 21*b* or 21*c*, address decoding is carried out in both the bank 0 and the bank 1 at the same time, and data consisting of 128 bits (eight words) is read out.

For example, pieces of data D0 to D3 are stored at an address ADD corresponding to the address value ADD in the SRAM cell array 21*b* or 21*c*. Furthermore, pieces of data D4 to D7 are stored at an address ADD+1, and pieces of data D8 to D11 are stored at an address ADD+2, respectively. In the SRAM cell array 21*b* or 21*c*, the address ADD+1 has a value obtained by advancing (increasing) the address ADD by one row address. Moreover, at this time, the bank 0 of the SRAM cell array 21*b* or 21*c* is selected based on Low of the bank address BANKADD. Therefore, the pieces of data (RAM_DATA [63:0]) D0 to D3 are output to the RAM/Register data bus to be stored in the data latch (A) 281 immediately before rising of the first external clock CLK.

When the asynchronous data selection signal ASYLATADD [1:0] is "11", an operation from the beginning to output of the data D3 as the output data signal DTOUT [15:0] is the same as that explained in conjunction with FIG. 3.

To output the data D4 as the output data signal DTOUT [15:0], the bank address BANKADD is changed to High, and the bank 1 of the SRAM cell array 21*b* or 21*c* is selected. As a result, the pieces of data D4 to D7 are output to the RAM/Register data bus. Further, the address value of the SRAM address MEMADD is changed to "ADD+2", and the row or column address is changed to start an operation of reading the data D8 to D11. The operation from the beginning to output of the data D4 as the output data signal DTOUT [15:0] in synchronization with a rising edge of the fourth external clock CLK when the pieces of data D4 to D7 are output to the RAM/Register data bus in this manner is the same as that explained in conjunction with FIG. 3.

As apparent from the above explanation, at the time of execution of the clock synchronous burst read function, a timing at which the data latch A open signal LATA and the data latch B open signal LATB is set to High or Low to store read data output to the RAM/Register data bust in the data latch (A) 281 or the data latch (B) 282 and a timing at which counting up addresses is started have the same setting irrespective of the bank structure of the SRAM cell array 21*a*,

21b, or 21c. Therefore, at the time of execution of the clock synchronous burst read function using the SRAM cell array 21a formed of one bank determined as a read target, when the start address STADD is the last column address in particular, increasing a speed of a clock frequency is difficult.

A description will now be given as to a clock synchronous burst read function that can increase a speed of a clock frequency even if the start address STADD is the last column address when the SRAM cell array 21a formed of one bank is determined as a read target. It is to be noted that FIG. 5 shows an example where a read latency is "4" and a last column address in the SRAM cell array 21a is set as a start address.

As shown in FIG. 5, when executing the clock synchronous burst read function with respect to the SRAM cell array 21a, the burst read control circuit 41 starts counting up the SRAM address MEMADD in a cycle (a first external clock CLK in FIG. 5) before reaching a read latency cycle (a fourth clock). Further, the data latch A open signal LATA is caused to fall at the same timing, and first access data D3 of a first word is latched to the data latch (A) 281. When counting up the SRAM address MEMADD is started at the first external clock CLK in this manner, the row address in the SRAM cell array 21a is changed, thereby starting a read operation for a second word.

On the other hand, data D4 of the second word is output at a fourth external clock CLK. Therefore, a period from changing the row address in the SRAM cell array 21a to transferring the data D4 to the data latch (B) 282 falls within three external clocks CLK. As a result, even if the start address STADD is the last column address, a margin for reading the data D4 to D7 can be sufficiently assured, thereby readily increasing a speed of a clock frequency.

As explained above, at the time of execution of the clock synchronous burst read function using the SRAM cell array 21 formed of one bank determined as the read target, a timing at which counting up the SRAM address MEMADD is started and a timing at which the data D3 of the first word is stored in the data latch (A) 281 have a setting different from the setting configured for execution of the clock synchronous burst read function using the SRAM cell array 21b or 21c formed of two banks determined as a read target.

That is, according to this embodiment, in the semiconductor memory device having SRAM cell arrays formed of the plurality of buffer memories having different bank structures, when executing the clock synchronous burst read function, a timing at which data output from the SRAM cell array is taken into the data latch and a timing at which counting up the SRAM address is started can be changed in accordance with the bank structure of SRAM cell array determined as a read target. As a result, at the time of execution of the clock synchronous burst read function using the SRAM cell array formed of one bank, even if the start address is a last column address in particular, a read margin can be assured, a speed of a clock frequency of external clocks can be increased, and a speed of an operation, e.g., the read operation can be also increased.

It is to be noted that, in this embodiment, the burst read control circuit 41 has a function of automatically changing a timing of starting counting up the SRAM address MEMADD and a timing of storing read data in the data latch (A) 281 when it determines that the start address STADD is an address in the SRAM cell array 21a by making reference to a read latency signal RL [2:0] and the start address STADD from the access controller 27, for example. As a result, in the same read latency, the timing of starting counting up the SRAM address and the timing of latching data in the data latch can be changed in accordance with not only the bank structure of the buffer memory as a read target but also each read latency. When these timings can be changed in accordance with each read latency, a data reading margin can be sufficiently assured, and a speed of a clock frequency can be easily increased.

[Second Embodiment]

FIG. 6 shows a structural example of a semiconductor memory device according to a second embodiment of the present invention. In this embodiment, the semiconductor memory device depicted in FIG. 1 is taken as an example, and a description will be given as to a case where sharing data lines of a plurality of buffer memories and registers enables increasing an operation speed. It is to be noted that FIG. 6 shows an example where the DQ buffer 26 and the RAM/Register data bus in FIG. 1 are substituted by a plurality of switch circuits and a common data bus.

As shown in FIG. 6, a switch circuit 55 is connected with each of SRAM cell arrays 21a, 21b, and 21c through each data line (corresponding to the SRAM data bus (64 bits) in FIG. 1) 51. On the other hand, a switch circuit 57 is connected with a register 34 via a register bus 56. The switch circuits 55 and 57 are connected with each other through a common data bus (64 bits) 54 and also connected with a burst buffer 28a or 28b in common.

Signal lines 52 and 53 are connected with the switch circuits 55 and 57 from an access controller 27, respectively. The signal lines 52 and 53 are also connected with the SRAM cell arrays 21a, 21b, and 21c and the register 34.

An operation when the above structure is adopted will now be briefly explained. In the case of a read operation, an address signal (Add <15:0>) and a read command (/OE) from an external host device are input to the access controller 27 via a user interface 29. Then, a buffer memory associated with the address signal (e.g., higher-order eight bits), e.g., the SRAM cell array 21b is accessed. Further, a read command from the external host device is also supplied to this SRAM cell array 21b via the user interface 29, and a read control signal from the access controller 27 is also supplied to the same via the signal line 52. This read control signal is also supplied to the corresponding switch circuit 55. As a result, the data line 51 of the SRAM cell array 21b is connected with the common data bus 54 via the switch circuit 55. Consequently, data of a corresponding address (position number) in the SRAM cell array 21b is output to the data line 51. Furthermore, the data output to the data line 51 is supplied to the burst buffer 28a through the common data bus 54, and then output to the external host device via the user interface 29.

It is to be noted that reading from the register 34 is carried out in the same manner by connecting the register bus 56 with the common data bus 54 via the switch circuit 57. Moreover, reading from the SRAM cell array 21a is carried out in the same manner by connecting the data line 51 with the common data bus 54 via the switch circuit 55. Additionally, reading from the SRAM cell array 21c is carried out in the same manner by connecting the data line 51 with the common data bus 54 via the switch circuit 55.

In the case of a write operation, like the read operation, an address signal (Add <15:0>) and a write command (/WE) are input to the access controller 27 from the external host device via the user interface 29. Then, a buffer memory associated with the address signal, e.g., the SRAM cell array 21b is accessed. Further, a write command from the external host device is supplied to this SRAM cell array 21b through the user interface 29, and a write control signal from the access controller 27 is also supplied to the same through the signal line 53. This write control signal is also supplied to the corresponding switch circuit 55. As a result, the data line 51 of the SRAM cell array 21b is connected with the common data bus 54 via the switch circuit 55.

On the other hand, write data from the external host device is output to the common data bus 54 through the user interface 29 and the burst buffer 28a. The write data output to the common data bus 54 is supplied to the SRAM cell array 21b via the switch circuit 55 and the data line 51 and written at a corresponding address (position number).

It is to be noted that writing in the register 34 is carried out in the same manner by connecting the register bus 56 with the common data bus 54 via the switch circuit 57. Moreover, writing in the SRAM cell array 21a is carried out in the same manner by connecting the data line 51 with the common data bus 54 through the switch circuit 55. Additionally, writing in the SRAM cell array 21c is carried out in the same manner by connecting the data line 51 with the common data bus 54 through the switch circuit 55.

As explained above, in the semiconductor memory device including the plurality of buffer memories, the data bus can be shared by the plurality of memories. That is, the switch circuit 55 can be used to switch, e.g., connection of each data line 51 of the SRAM cell array 21a, 21b, or 21c with the common data bus 54 and connection of the register bus 56 of the register 34 with the common data bus 54. As a result, the number of the common data buses 54 connected with the burst buffer 28a or 28b can be determined as a minimum necessary number. In particular, In the case of the semiconductor memory device in which the plurality of types of SRAM cell arrays 21, 21b, and 21c and the register 34 are integrated on one chip, a wiring layout can be greatly reduced.

Here, like a semiconductor memory device disclosed in Jpn. Pat. Appln. KOKAI Publication No. 2008-84499, in a semiconductor memory device having a plurality of memory devices (data regions) on one chip, when a necessary number of data buses are arranged in accordance with each memory device, the number of data buses is increased. For the semiconductor memory device in which a future increase in the number of memory devices is expected, arrangement of a wiring layout affects a chip size.

Therefore, sharing the data bus can realize not only a reduction in a chip size based on a decrease in a wiring layout but also an increase in an operation speed based on a rise of a bus width (a reduction in resistance).

It is to be noted that, in this embodiment, the wiring layout can be sufficiently reduced not only in a case where the register 34 is connected with the common data bus 34 but also in a case where at least the SRAM cell array 21a, 21b, or 21c alone is connected with the common data bus 54.

Figure 7A:
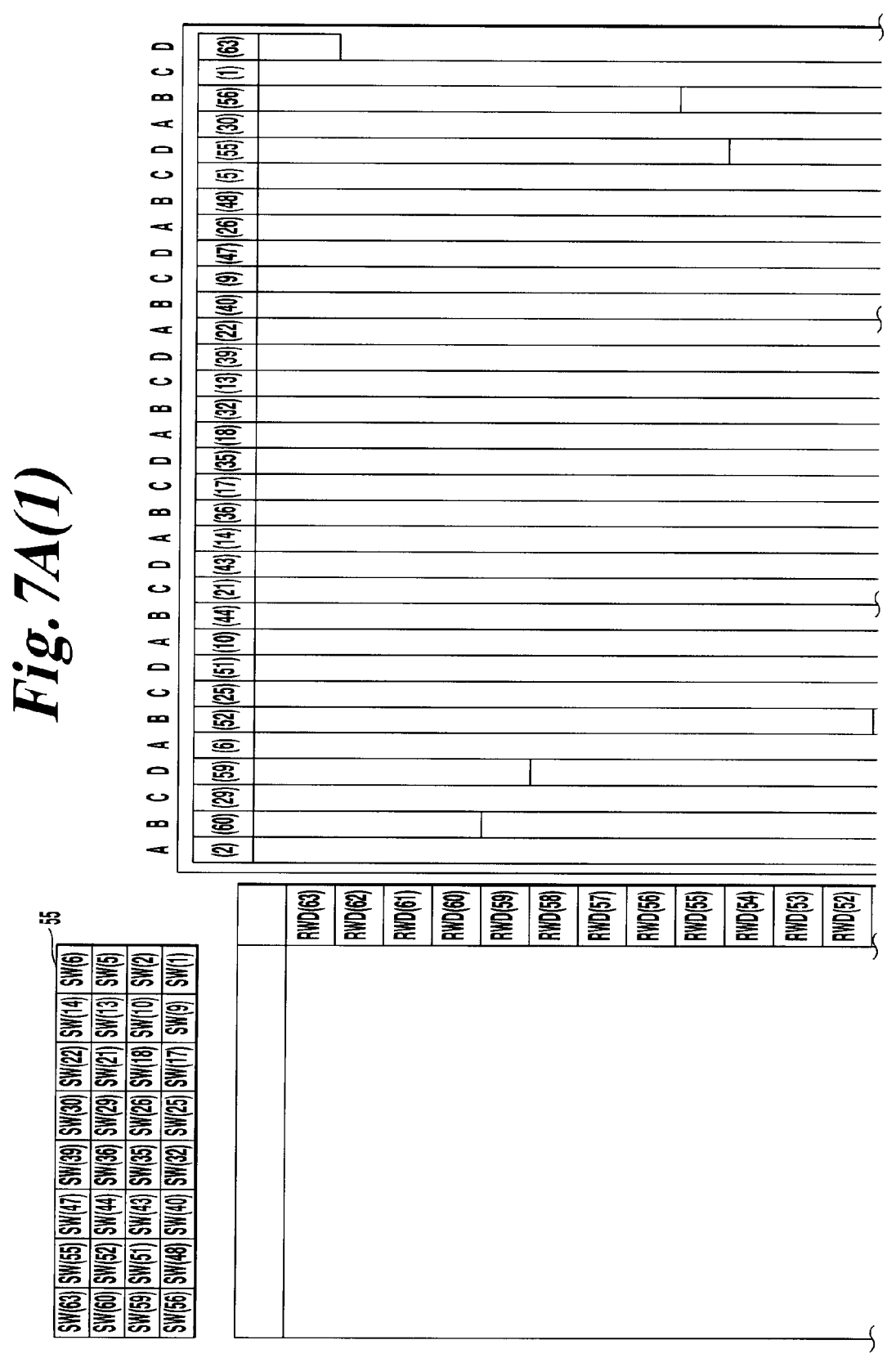

FIGS. 7A(1)-7B(4) show a wiring layout example of the data line 51 in the SRAM cell array 21a, 21b, or 21c. It is to be noted that both banks 0 and 1 have the same structure (layout) and hence the bank 0 alone will be explained.

As shown in FIGS. 7A(1)-7B(4), for example, the bank 0 is laterally divided into two pieces, and 64 data lines <63:0>51 are arranged between these pieces. The left and right banks 0 and the data lines <63:0>51 are substantially symmetrically arranged with respect to the center in the lateral direction.

That is, as the data lines <63:0> 51, long data lines and short data lines corresponding to positions of read/write data lines RWD <0> to RWD <63> of the left and right pieces of the bank 0 are alternately arranged. For example, a relatively short data line <57> 51 connected with a read/write data line RWD <57> is arranged on a right-hand side of a relatively long data line <0> 51 connected with a read/write data line RWD <0>, and a relatively short data line <62> 51 connected with a read/write data line RWD <62> is arranged on a left-hand side of the same, respectively.

Moreover, the data lines <63:0> 51 are arranged in such a manner that data lines that are simultaneously activated in the write operation are not adjacent to each other. In this embodiment, for example, 16 data lines, <2>, <6>, <10>, <14>, <18>, <22>, <26>, <30>, <62>, <54>, <46>, <38>, <34>, <42>, <50>, and <58>, corresponding to "A" are simultaneously activated. Additionally, for example, 16 data lines <60>, <52>, <44>, <36>, <32>, <40>, <48>, <56>, <0>, <4>, <8>, <12>, <16>, <20>, <24>, and <28> corresponding to "B" are simultaneously activated. Further, 16 data lines <29>, <25>, <21>, <17>, <13>, <9>, <5>, <1>, <57>, <49>, <41>, <33>, <37>, <45>, <53>, and <61> corresponding to "C" are simultaneously activated. Furthermore, 16 data lines <59>, <51>, <43>, <35>, <39>, <47>, <55>, <63>, <31>, <27>, <23>, <19>, <15>, <11>, <7>, and <3> corresponding to "D" are simultaneously activated.

On the other hand, the switch circuit 55 has switches SW0 to SW63 connected to the data lines <63:0> 51, respectively. Switches connected with long data lines in the switches SW0 to SW63, e.g., a switch SW0 connected with the data line <0> 51 and a switch SW1 connected with the data line <1> 51 are provided on a side (an inner side of the switch circuit 55) close to a core (the data lines <63:0> 51), respectively. On the other hand, switches connected with short data lines, e.g., a switch SW62 connected with the data line <62> 51 and a switch SW63 connected with the data line <63> 51 are provided on a side (an outer side of the switch circuit 55) far from the core (the data lines <63:0> 51), respectively. As a result, wiring capacities of the data lines <63:0> 51 connected with the switch circuit 55 are adjusted to become uniform.

When such a structure is adopted, the data lines adjacent to each other are not simultaneously activated in the write operation. Further, since the long data lines and the short data lines are alternately arranged as the data lines adjacent to each other, a coupling capacitance between the data lines can be suppressed. As a result, interference of the data lines can be reduced, thus increasing a speed of the operation.

[Third Embodiment]

Figure 8:
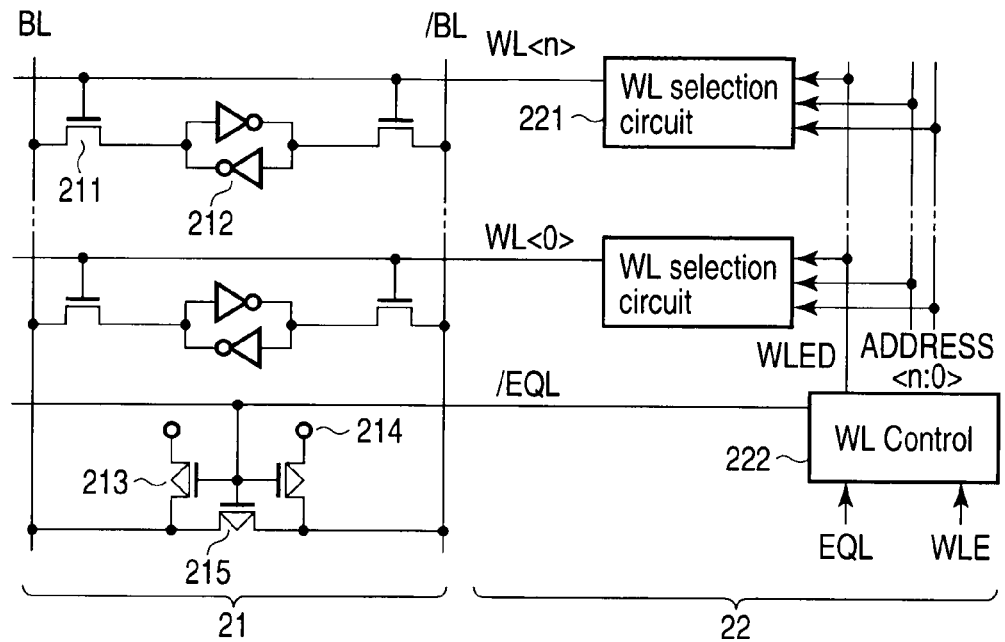
FIG. 8 is a circuit diagram showing a primary part of a structure of a semiconductor memory device according to a third embodiment of the present invention.

FIG. 8 shows a structural example of a semiconductor memory device according to a third embodiment of the present invention. In this embodiment, the semiconductor memory device depicted in FIG. 1 is taken as an example, and a description will be given as to structures of SRAM cell arrays 21a, 21b, and 21c and row decoders 22a, 22b, and 22c. It is to be noted that both the SRAM cell arrays 21a, 21b, and 21c and the row decoders 22a, 22b, and 22c basically have the same structures, and hence the SRAM cell arrays 21a, 21b, and 21c and the row decoders 22a, 22b, and 22c will be simply explained as an SRAM cell array 21 and a row decoder 22, respectively.

As shown in FIG. 8, the SRAM cell array 21 includes a plurality of matrix-like SPAM cells 212 respectively arranged at intersecting positions of word lines WL <0> to WL <n> and a pair of bit lines BL and /BL. Each SRAM cell 212 has two C-MOS inverters connected in parallel in opposite directions. A gate of each SRAM cell 212 is connected with the pair of bit lines BL and /BL through each transfer transistor (an N-MOS transistor) 211 connected with any one of the word lines WL <0> to WL <n>. Furthermore, in the SRAM cell array 21, a bit line pre-charge transistor (a P-MOS transistor) 213 that is used to pre-charge potentials of the pair of bit lines BL and /BL by using a VDD power supply 214 and an equalizing transistor (a P-MOS transistor) 215 are provided at intersecting positions of an equalizing line /EQL and the pair of bit lines BL and /BL.

The row decoder 22 has WL selection circuits 221 and a WL control circuit 222. The WL selection circuit 221 is provided in accordance with each of the word lines WL <0> to WL <n>. The WL control circuit 222 controls the WL selection circuits 221 and the equalizing line /EQL.

The WL selection circuits 221 and the WL control circuit 222 pre-charge potentials of the pair of bit lines BL and /BL by using the VDD power supply 214 and also temporarily control potentials of the corresponding word lines WL <0> to WL <n> to a "0" level when pre-charging and equalizing the pair of bit lines BL and /BL under control of an access controller 27.

Figure 9:
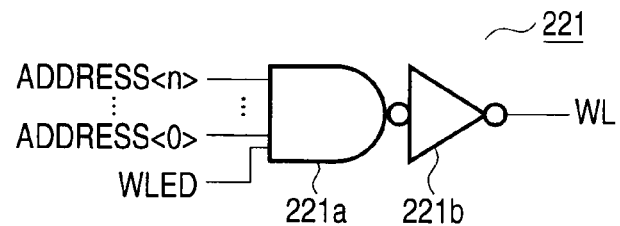
FIG. 9 is a circuit diagram showing a structural example of a WL selection circuit constituting an SRAM row decoder in the semiconductor memory device according to the embodiment.

FIG. 9 shows a structural example of the WL selection circuit 221. The WL selection circuit 221 has, e.g., a NAND element 221a and a C-MOS inverter 221b connected in series. A control signal line WLED from the WL control circuit 222 and address signal lines (ADDRESS <0> to ADDRESS <N>) from the access controller 27 are connected with the NAND element 221, for example. The C-MOS inverter 221b inverts an output from the NAND element 221a to output a selection signal (an ON/OFF signal) WL required to select the word lines WL <0> to WL <n>.

Figure 10:
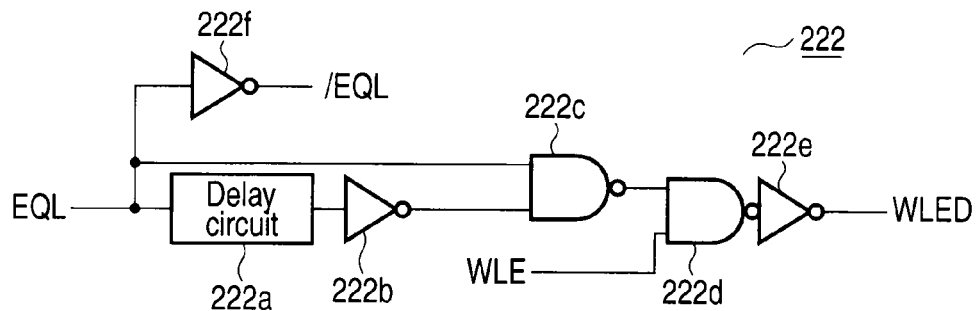
FIG. 10 is a circuit diagram showing a structural example of a WL control circuit constituting the SRAM row decoder in the semiconductor memory device according to the embodiment.

FIG. 10 shows a structural example of the WL control circuit 222. The WL control circuit 222 has, e.g., a delay circuit 222a, C-MOS inverters 222b, 222e, and 222f, and NAND elements 222c and 222d. A control signal EQL or WLE from the access controller 27 is supplied to the WL control circuit 222, for example. The control signal EQL is supplied to an input terminal of the delay circuit 222a, one input terminal of the NAND element 222c, and an input terminal of the C-MOS inverter 222f, respectively. The equalizing line /EQL is connected with an output terminal of the C-MOS inverter 222f. An output from the delay circuit 222a is supplied to the other input terminal of the NAND element 222c via the C-MOS inverter 222b. An output from this NAND element 222c is supplied to one input terminal of the NAND element 222d. The control signal WLE is supplied to the other input terminal of the NAND element 222d. An output from this NAND element 222d is output to the control signal line WLED via the C-MOS inverter 222e.

Figure 11:
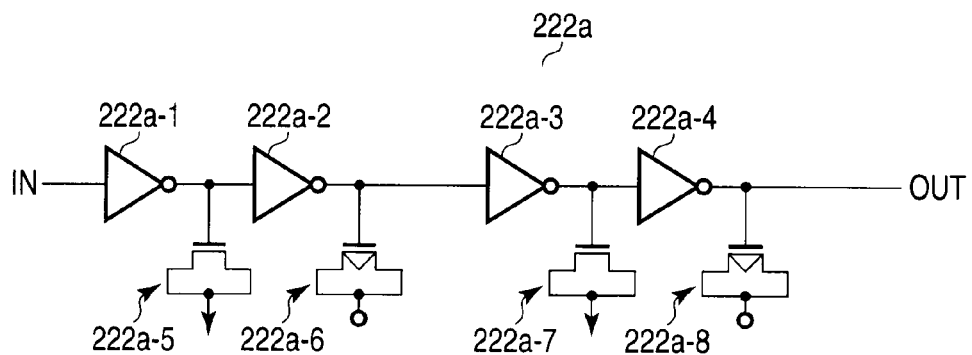
FIG. 11 is a circuit diagram showing a structural example of a delay circuit constituting the WL control circuit depicted in FIG. 10.

FIG. 11 shows a structural example of the delay circuit 222a. The delay circuit 222a has, e.g., four C-MOS inverters 222a-1, 222a-2, 222a-3, and 222a-4 connected in series, N-MOS capacitors 222a-5 and 222a-7 connected with output terminals of the C-MOS inverters 222a-1 and 222a-3, and P-MOS capacitors 222a-6 and 222a-8 connected with output terminals of the C-MOS inverters 222a-2 and 222a-4. The N-MOS capacitors 222a-5 and 222a-7 are connected with a GND power supply and the P-MOS capacitors 222a-6 and 222a-8 are connected with a VDD power supply, respectively.

Figure 12:
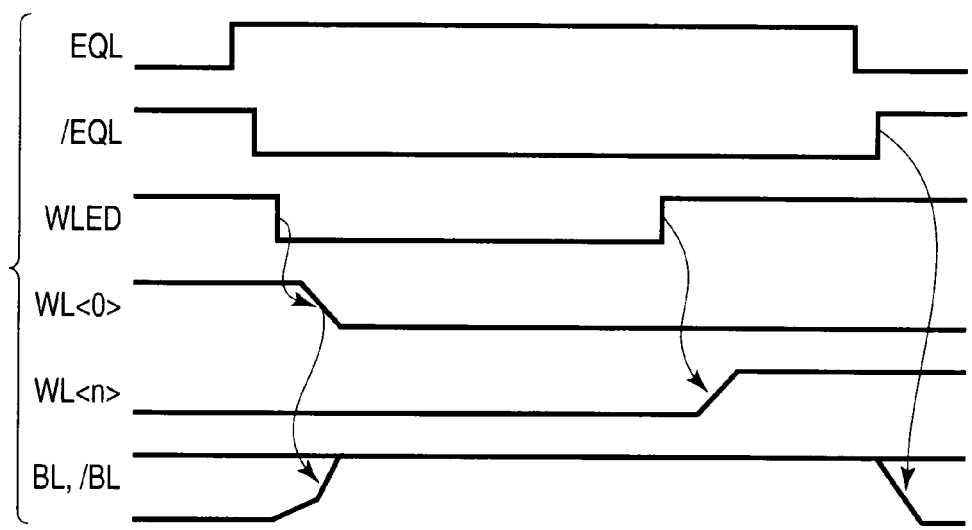
FIG. 12 is a timing chart for explaining an operation when switching word lines in the SRAM.

FIG. 12 shows an operation when switching the word lines in the above-explained structure. That is, when switching the word lines WL <0> to WL <n>, potentials of the pair of bit lines BL and /BL must be pre-charged and equalized. In the SRAM cell array 21 according to this embodiment, the pair of bit lines BL and /BL are pre-charged to a potential VDD by using the VDD power supply 214 in this regard. Furthermore, during this pre-charging operation, potentials of the corresponding word lines WL <0> to WL <n> are temporarily reduced to the "0" level.

For example, it is assumed that the control signal EQL at a High level is supplied to the WL control circuit 222 of the row decoder 22 from the access controller 27. Then, both the equalizing line /EQL and the control signal line WLED are changed to a Low level. As a result, the word lines WL <0> to WL <n> associated with address signals supplied to address signal lines (ADDRESS <0> to ADDRESS <N>) of the WL selection circuit 221 are turned off (disabled) by a selection signal WL. As a result, potentials of the corresponding word lines WL <0> to WL <n> are reduced to the "0" level, and transfer transistors 211 connected with the word lines WL <0> to WL <n> are turned off. Separating the pair of bit lines BL and /BL from nodes of the SRAM cells 212 in this manner enables reducing a time required to pre-charge the pair of bit lines BL and /BL. Furthermore, since loads of the pair of bit lines BL and /BL are decreased, sizes of the pre-charge and equalizing transistors 213 and 215 can be reduced.

As explained above, in the SRAM cell array 21 where the pair of bit lines BL and /BL are pre-charged and equalized by using the VDD power supply 214, turning off the transfer transistors 211 during pre-charge enables reducing a pre-charge time.

That is, for example, like a semiconductor memory device disclosed in Jpn. Pat. Appln. KOKAI Publication No. 2008-65863, in an SRAM cell array having a six-transistor structure, when pre-charging bit lines by using an external power supply at the time of switching word lines, a transfer transistor having a gate connected with the word line is kept in an ON state since a node of an SRAM cell holding data "0" is connected with a pair of bit lines in a conventional example. Therefore, pre-charging the pair of bit lines takes time. Moreover, a transistor for pre-charging requires a large size.

According to this embodiment, turning off the transfer transistor at the time of pre-charging and separating the SRAM cell from the pair of bit lines enables eliminating an inconvenience that connection achieved between the node of the SRAM cell holding the data "0" and the pair of bit lines slows pre-charging the pair of bit lines. Therefore, an operation speed can be increased based on a reduction in pre-charge time, and a layout can be decreased based on downsizing of transistors.

It is to be noted that each of the WL selection circuit, the WL control circuit, and the delay circuit is not restricted to the structure according to this embodiment.

Additionally, the present invention is not restricted to the SRAM cell array in the semiconductor memory device, and an SRAM adopting a mode in which bit lines are pre-charged by using a VDD power supply can be likewise applied.

[Fourth Embodiment]

FIG. 13 shows a structural example of a semiconductor memory device according to a fourth embodiment of the present invention. In this embodiment, the semiconductor memory device depicted in FIG. 1 will be taken as an example, and a description will be given as to a configuration of a switch circuit 57 (see FIG. 6) connected with a register 34. It is to be noted that a description will be given as to a case where the register 34 has a register data region (bits) storing register data (16 bits in this example) as a control signal and a reserve data region (bits) storing register data including reserve data (e.g., five bits). The reserve data is data of a "0" level that is added to, e.g., a top bit to set a register data of 16 bits or below (e.g., a latency or a burst length) as a register data of virtual 16 bits when a control signal is the register data of 16 bits or below. However, the reserve data is read out from a reserve data bit corresponding to a reserve address, and the register 34 does not have a dedicated latch that stores the reserve data.

Before explaining the structure of the switch circuit 57, when register data of register data bits and reserve data of reserve data bits are present in the register 34, a register data bus (corresponding to the register bus 56 in FIG. 6) is shared. The number of read bits (data) in a single access operation is determined, and whether the reserve data is included in the bits varies depending on a selected address. For example, in reading of an address "a" (a previous cycle), the register data bus is used to propagate register data (a "1" or "0" level). In reading of a following address "b" (a subsequent cycle), the same register data bus is used to propagate the register data + reserve data (the "0" level).

However, in the register data bus after propagating "1" as the register data to the data bus (corresponding to the common data bus 54 in FIG. 6) in the previous cycle, data of the "1" level remains as a history. Therefore, when a request of reading the register data including the reserve data is issued, the data of the "1" level remaining in the register data bus cannot be changed to the data of the "0" level to be output in regard to reserve data bits that do not have a function (a latch) of holding the reserve data of the "0" level. That is, there occurs an inconvenience that the data of the "1" level is erroneously output as the serve data as it is.

This embodiment relates to processing of output data at the time of reading register data including reserve data from a register in a semiconductor memory device, and reserve data can be secured by resetting a history of a previous cycle remaining in a register data bus before reading data.

A structural example of the switch circuit 57 according to this embodiment will now be explained.

As shown in FIG. 13, the switch circuit 57 has a read buffer (REG_READ_BUFFER) 57a for reading, a write buffer (REG_WRITE_BUFFER) 57b for writing, and a multi-select protection circuit 57c that controls the read buffer 57a and the write buffer 57b. The read buffer 57a has an input terminal connected with a register 34 through a register data bus and an output terminal connected with a data bus. The write buffer 57b has an output terminal connected with the register 34 via the register data bus and an input terminal connected with the data bus. The multi-select protection circuit 57c is connected with the read buffer 57a and the write buffer 57b. The multi-select protection circuit 57c receives a WRITE signal or a READ signal involved by input of a control signal /WE (write enable) to an access controller 27, and supplies an RD_REG signal to the read buffer 57a and a WT_REG signal and a reset signal REGRWDRSTn to the write buffer 57b, respectively. The reset signal REGRWDRSTn is a signal that forcibly resets a potential of the register data bus to the "0" level before a subsequent reading cycle at the time of a read operation or a write operation, for example. It is to be noted that the multi-select protection circuit 57c has a function of avoiding a reading error and a writing error (writing of Invalid Data) that occur when this reset operation overlaps the read operation or the write operation.

FIG. 14 shows a structural example of the read buffer 57a and the write buffer 57b. In this example, a description will be given as to an example where both the read buffer 57a and the write buffer 57b are formed of simple circuits.

That is, the read buffer 57a has, e.g., inverter elements 57a-1, 57a-2, and 57a-3, a NAND element 57a-4, a NOR element 57a-5, and a P-MOS transistor 57a-6 and an N-MOS transistor 57a-7 connected in series. The register data bus is connected with an input terminal of the inverter element 57a-1. An output terminal of the inverter element 57a-1 is connected with an input terminal of the inverter element 57a-2, and an output terminal of this inverter element 57a-2 is connected with one input terminal of the NAND element 57a-4 and one input terminal of the NOR element 57a-5, respectively.

A signal line through which the RD_REG signal is supplied is connected with an input terminal of the inverter element 57a-3 and the other input terminal of the NAND element 57a-4, respectively. An output terminal of the inverter element 57a-3 is connected with the other input terminal of the NOR element 57a-5.

An output terminal of the NAND element 57a-4 is connected with a gate of the P-MOS transistor 57a-6, and an output terminal of the NOR element 57a-5 is connected with a gate of the N-MOS transistor 57a-7. The data bus is connected with a connection point (a common drain) of the P-MOS transistor 57a-6 and the N-MOS transistor 57a-7. A source of the P-MOS transistor 57a-6 is connected with, e.g., a VDD power supply, and a source of the N-MOS transistor 57a-7 is connected with, e.g., a GND power supply.

On the other hand, the write buffer 57b has, e.g., inverter elements 57b-1, 57b-2, and 57b-3, NAND elements 57b-4 and 57b-6, an OR element 57b-5, and a P-MOS transistor 57b-7 and an N-MOS transistor 57b-8 connected in series. At the time of a reset operation, this N-MOS transistor 57b-8 functions as a reset transistor. The data bus is connected with an input terminal of the inverter element 57b-1. An output terminal of the inverter element 57b-1 is connected with an input terminal of the inverter element 57b-2, and an output terminal of this inverter element 57b-2 is connected with a first input terminal of the NAND element 57b-4 and one input terminal of the OR element 57b-5, respectively.

A signal line through which the WT_REG signal is supplied is connected with an input terminal of the inverter element 57b-3 and a second input terminal of the NAND element 57b-4, respectively. An output terminal of the inverter element 57b-3 is connected with the other input terminal of the OR element 57b-5. An output terminal of the OR element 57b-5 is connected with one input terminal of the NAND element 57b-6. A signal line through which the reset signal REGRWDRSTn is supplied is connected with the other input terminal of the NAND element 57b-6 and a third input terminal of the NAND element 57b-4.

An output terminal of the NAND element 57b-4 is connected with a gate of the P-MOS transistor 57b-7, and an output terminal of the NAND element 57b-6 is connected with a gate of the N-MOS transistor 57b-8. The register data bus is connected with a connection point (a common drain) of the P-MOS transistor 57b-7 and the N-MOS transistor 57b-8. A source of the P-MOS transistor 57b-7 is connected with, e.g., a VDD power supply, and a source of the N-MOS transistor 57b-8 is connected with, e.g., a GND power supply.

In this embodiment, for example, before a read operation with respect to the register 34, the reset signal REGRWDRSTn that in an inactive state (a Low level) is input to the write buffer 57b, and a reset transistor utilizing the N-MOS transistor 57b-8 is turned on. As a result, a potential of the register data bus connected with the N-MOS transistor 57b-8 is reset to the "0" level.

FIG. 15 shows a structural example of the multi-select protection circuit 57c. The multi-select protection circuit 57c has a reset pulse generator (Reset_PLS_Gen.) 571 that generates a reset pulse RST_PLS before a read operation with respect to the register 34, e.g., at the end of a write operation or the start of access or in an enabled state of a control signal /CE (chip enable). The reset pulse RST_PLS from the reset pulse generator 571 is supplied to an input terminal of an inverter element 572 and one input terminal of a NOR element 578. An output from the inverter element 572 is supplied as a signal RST_PLSDn to a first input terminal of a NAND element 576, a first input terminal of a NAND element 577, and one input terminal of a NAND element 593 through a delay element (Delay↑) 573 and inverter elements 574 and 575.

A READ signal is supplied to a second input terminal of the NAND element 576. This READ signal enters an active state (a High level) when a control signal /WE (write enable) for the access controller 27 is on the High level. An output from the NAND element 576 is supplied to the other input terminal of the NOR element 578. An output from the NOR element 578 is changed into an RD_REG signal through inverter elements 579, 580, 581, and 582.

A WRITE signal is supplied to a second input terminal of the NAND element 577. This WRITE signal enters an active state (the High level) when the control signal /WE (write enable) for the access controller 27 is on the Low level. An output from the NAND element 577 is supplied to one input terminal of a NAND element 583 and one input terminal of a NOR element 587. A third input terminal of the NAND element 576 and a third input terminal of the NAND element 577 are connected with each other.

An output from a delay element 592 is supplied to the other input terminal of the NAND element 583, and an output from the NAND element 583 is supplied to the other input terminal of the NAND element 593 and an input terminal of an inverter element 585 through an inverter element 584. An output from the inverter element 585 is supplied to the other input terminal of the NOR element 587 via a delay element 586.

An output from the NOR element 587 is supplied to the delay element 592 via an inverter element 588 and changed into a WT_REG signal through inverter elements 589, 590, and 591. An output from the NAND element 593 is changed into the reset signal REGRWDRSTn through inverter elements 594 and 595.

Figure 16:
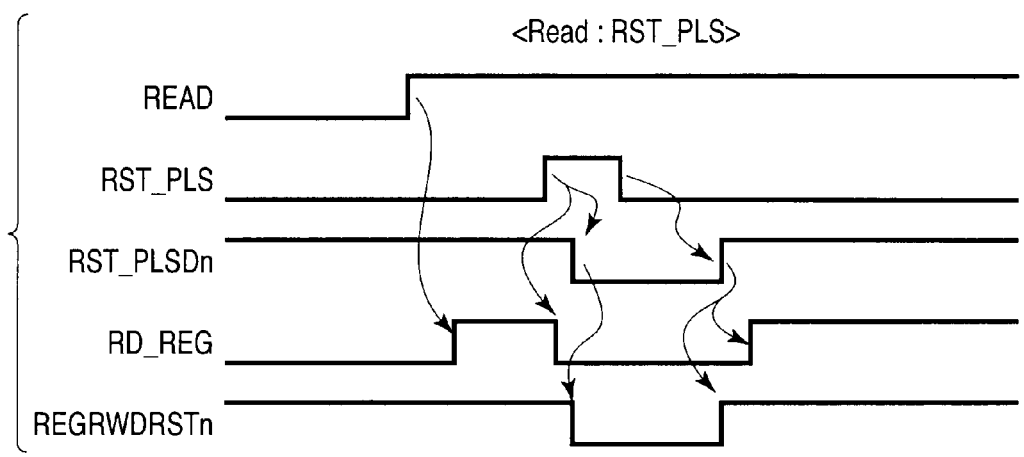
FIG. 16 is a timing chart for explaining a reset operation by the switch circuit.

FIG. 16 is a view for explaining a reset operation <Read: RST_PLS> by the switch circuit 57 having the above structure.

First, when the READ signal supplied to the multi-select protection circuit 57c is activated, the RD_REG signal is activated. Further, when the reset pulse RST_PLS is generated from the reset pulse generator 571, the RD_REG signal is inactivated, and the signal RST_PLSDn is inactivated. As a result, the reset signal REGRWDRSTn enters an inactive state. When this reset signal REGRWDRSTn is supplied to the write buffer 57b, the N-MOS transistor 57b-8 is turned on, and a potential of the register data bus is reset to the "0" level.

It is to be noted that, when the reset pulse RST_PLS from the reset pulse generator 571 is turned off, the signal RST_PLSDn is activated. As a result, the reset signal REGRWDRSTn is activated, and then the RD_REG signal is again activated.

Figure 17:
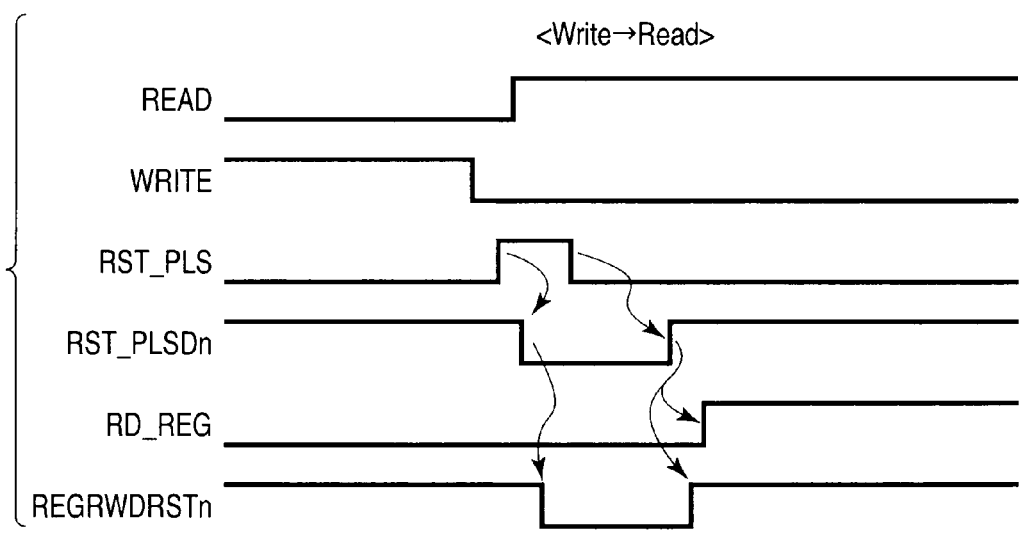
FIG. 17 is a timing chart for explaining another reset operation by the switch circuit.

FIG. 17 is a view for explaining a reset operation <Write→Read> by the switch circuit 57 having the above-described structure.

First, when the WRITE signal supplied to the multi-select protection circuit 57c is inactivated, the reset pulse RST_PLS is generated from the reset pulse generator 571 before the READ signal is activated. Then, the signal RST_PLSDn is inactivated. As a result, the reset signal REGRWDRSTn enters an inactive state. When this reset signal REGRWDRSTn is supplied to the write buffer 57b, the N-MOS transistor 57b-8 is turned on, and a potential of the register data bus is reset to the "0" level.

It is to be noted that when the reset pulse RST_PLS from the reset pulse generator 571 is turned off after the READ signal is activated, the signal RST_PLSDn is activated. As a result, the reset signal REGRWDRSTn is activated, and then the RD_REG signal enters the active state.

As explained above, after completion of the reset operation, when the reset signal REGRWDRSTn is changed to the High level and the RD_REG signal is selected, newly read register data is propagated through the register data bus. At this time, even when reserve data is included in the newly read register data, the reserve data is correctly propagated as data at the "0" level. That is, a potential of the reserve data bus connected with reserve data bits is in a reset (the "0" level) state, whereby the register data (the "1" or "0" level) + the reserve data (the "0" level) can be output.

In this embodiment, when the reset pulse RST_PLS is turned on for a read operation in the next cycle, the multi-select protection circuit 57c outputs the reset signal REGRWDRSTn that resets a potential of the register data bus to the "0" level while the RD_REG signal is in the OFF state. During this period, the multi-select protection circuit 57c do not perform generation of the reset signal REGRWDRSTn (the Low level) and selection of a read operation (the RD_REG signal at the High level) and a write operation (the WT_REG signal at the High level) at the same time.

As explained above, before the read operation with respect to the register 34, the potential of the register data bus is reset to the "0" level. That is, in the read operation for the register 34, when selected data is all register data, this register data is propagated through the register data bus and output to the data bus via the read buffer 57a. In this case, previous register data remains in the register data bus as a history. Thus, the register data remaining in the register data bus is reset by the N-MOS transistor 57b-8 of the write buffer 57b before reading data. Therefore, even if data that is read in the next cycle is register data including reserve data, the reserve data can be assuredly secured, which contributes to an increase in operation speed.

In particular, an increase in circuit area can be suppressed as compared with a case where a function (a latch) that holds reserve data on the "0" level is provided.

It is to be noted that the description has been given as to the case where the N-MOS transistor 57b-8 in the write buffer 57b is utilized to reset a potential of the register data bus, but the present invention is not of course restricted thereto.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device configured to perform a clock synchronous burst read operation, comprising:
a plurality of buffer memories having different bank structures;
first and second data latch circuits storing read data read from the plurality of buffer memories; and
a control circuit that controls a timing of starting counting up addresses and a timing of storing read data in the first data latch circuit at the time of the clock synchronous burst read operation in accordance with the number of the banks of the buffer memory as a read operation target.

2. The device according to claim 1, wherein, when the buffer memory as the read operation target is constituted of one bank and a start address is a last column address in the buffer memory,
the control circuit starts counting up the start address and stores read data of a first word in the first data latch circuit in a cycle before reaching a read latency cycle.

3. The device according to claim 2, wherein the control circuit switches a row address to execute a read operation for a second word by starting counting up the start address in the cycle before reaching the read latency cycle, and stores read data of the second word in the second data latch circuit in a cycle reaching the read latency cycle.

4. The device according to claim 1, wherein the plurality of buffer memories are connected with a common data bus.

5. The device according to claim 4, wherein at least one register is further connected with the common data bus.

6. The device according to claim 5, wherein the at least one register has a register data bus connected with the common data bus, and a potential of the register data bus is reset before a read operation.

7. The device according to claim 1, wherein each bank of the plurality of buffer memories is laterally separated into two, and long data lines and short data lines are alternately arranged between the separated banks.

8. The device according to claim 1, wherein each of the plurality of buffer memories has a plurality of static random access memory (SRAM) cells, and each of the plurality of SRAM cells is connected with a pair of bit lines through each transfer transistor whose gate is connected with a word line.

9. The device according to claim 8, wherein the transfer transistor in each of the plurality of buffer memories is turned off when pre-charging the pair of bit lines by using a power supply.

10. The device according to claim 1, wherein the control circuit issues the start address and opens the first data latch circuit to store data corresponding to the start address, outputs the read data of the first word from the first data latch circuit asynchronously with the clock, counts up the start address before a lapse of the read latency cycle from an issuance of the start address, opens the second latch circuit to store data corresponding to an address obtained by the counting up the start address in the cycle reaching the read latency cycle, and outputs sequentially the read data of the second word, a third word, and a fourth word from the second data latch circuit synchronously with the clock.

11. A semiconductor memory device configured to perform a clock synchronous burst read operation, comprising:

a plurality of buffer memories having different bank structures;

first and second data latch circuits storing read data read from the plurality of buffer memories; and a control circuit that controls a timing of starting counting up addresses and a timing of storing read data in the first data latch circuit at the time of the clock synchronous burst read operation in accordance with a read latency signal.

12. The device according to claim 11, wherein, when the buffer memory as a read operation target is constituted of one bank and a start address is a last column address in the buffer memory, the control circuit starts counting up the start address and stores read data of a first word in the first data latch circuit in a cycle before reaching a read latency cycle.

13. The device according to claim 12, wherein the control circuit switches a row address to execute a read operation for a second word by starting counting up the start address in the cycle before reaching the read latency cycle, and stores read data of the second word in the second data latch circuit in a cycle reaching the read latency cycle.

14. The device according to claim 11, wherein the plurality of buffer memories are connected with a common data bus.

15. The device according to claim 14, wherein at least one register is further connected with the common data bus.

16. The device according to claim 15, wherein the at least one register has a register data bus connected with the common data bus, and a potential of the register data bus is reset before a read operation.

17. The device according to claim 11, wherein each of the plurality of buffer memories is laterally separated into two, and long data lines and short data lines are alternately arranged between the separated banks.

18. The device according to claim 11, wherein each of the plurality of buffer memories has a plurality of static random access memory (SRAM) cells, and each of the plurality of SRAM cells is connected with a pair of bit lines through each transfer transistor whose gate is connected with a word line.

19. The device according to claim 18, wherein the transfer transistor in each of the plurality of buffer memories is turned off when pre-charging the pair of bit lines by using a power supply.

* * * * *